US006824895B1

(12) United States Patent
Sowinski et al.

(10) Patent No.: US 6,824,895 B1
(45) Date of Patent: Nov. 30, 2004

(54) ELECTROLUMINESCENT DEVICE CONTAINING ORGANOMETALLIC COMPOUND WITH TRIDENTATE LIGAND

(75) Inventors: Allan F. Sowinski, Rochester, NY (US); Joseph C. Deaton, Rochester, NY (US); Shouquan Huo, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/729,246

(22) Filed: Dec. 5, 2003

(51) Int. Cl.$^7$ .............................................. H05B 33/14
(52) U.S. Cl. ...................... 428/690; 428/917; 313/504; 313/506
(58) Field of Search ................................ 428/690, 917; 313/504, 506; 252/301.16

(56) References Cited

U.S. PATENT DOCUMENTS

| | | | |
|---|---|---|---|
| 6,048,630 A | 4/2000 | Burrows et al. | |
| 2002/0179885 A1 | 12/2002 | Che et al. | |

OTHER PUBLICATIONS

Wu et al., Angewandte Chemie International Edition, 39(21), p. 3933–3935, (2000).*

E. C. Constable, et al., "Cyclometallation Reactions of 6–Phenyl–2,2'–bipyridine; a Potential C,N,N–Donor Analogue of 2,2':6',2"–Terpyridine. Crystal and Molecular Structure of Dichlorobis(6–phenyl–2,2'–bipyridine)ruthenium(II)", J. Chem. Soc., 1990, pp. 443–449.

T. Cheung, et al., "Photoluminescent cyclometallated diplatinum(II,II) complexes: photophysical properties and crystal structures of [PtL(PPh$_3$)ClO$_4$ and [Pt$_2$L$_2$($\mu$–dppm)] [ClO$_4$]$_2$ (HL=6–phenyl–2,2'–bipyridine, dppm=Ph$_2$PCH$_2$PPh$_2$)", J. Chem. Soc., 1996, pp. 1645–1651.

S. Lai, et al., "Luminescent Mononuclear and Binuclear Cyclometalated Palladium(II) Complexes of 6–Phenyl–2, 2'–bipyridines: Spectroscopic and Structural Comparisons with Platinum(II) Analgoues", Inorg. Chem., 2000, 39, 255–262.

A. Hofmann, et al., "Cyclometalated Analogues of Platinum Terpyridine Complexes: Kinetic Study of the Strong $\sigma$–Donor Cis and Trans Effects of Carbon in the Presence of a $\pi$–Acceptor Ligand Backbone", Inorganic Chemistry, vol. 42, No. 20, 2003, pp. 6528–6538.

* cited by examiner

*Primary Examiner*—Dawn Garrett
(74) *Attorney, Agent, or Firm*—Arthur E. Kluegel

(57) ABSTRACT

Disclosed is an electroluminescent device comprising a cathode, an anode, and, located there between, a light emitting layer (LEL) containing a light emitting material that contains an organometallic complex comprising Pt or Pd metal and a tridentate (N^N^C) ligand, wherein the tridentate (N^N^C) ligand represents a ligand that coordinates to the metal through a nitrogen donor bond, a second nitrogen donor bond, and a carbon-metal bond, in that order, wherein at least one of the nitrogen donors is part of an aromatic ring or an imine group, and wherein the Pt or Pd atom also forms a bond to an anionic ligand group L, wherein L represents alkyl, alkenyl, aryl, or a cyano carbon, or halogen, or RX, wherein X represents a substituent that forms a bond to the Pt or Pd atom and wherein X represents N, O, S, or Se, and R represents a substituent. Such a device provides useful light emissions.

31 Claims, 9 Drawing Sheets

US 6,824,895 B1

ELECTROLUMINESCENT DEVICE CONTAINING ORGANOMETALLIC COMPOUND WITH TRIDENTATE LIGAND

FIELD OF THE INVENTION

This invention relates to an organic light emitting diode (OLED) electroluminescent (EL) device comprising a light emitting layer (LEL) containing a light emitting material that contains an organometallic complex comprising Pt or Pd metal and a tridentate (N^N^C) ligand, wherein the tridentate (N^N^C) ligand represents a ligand that coordinates to the metal through a nitrogen donor bond, a second nitrogen donor bond, and a carbon-metal bond, in that order.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172, 862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. The organic layers in these devices, usually composed of a polycyclic aromatic hydrocarbon, were very thick (much greater than 1 $\mu$m). Consequently, operating voltages were very high, often >100V.

More recent organic EL devices include an organic EL element consisting of extremely thin layers (e.g., <1.0 $\mu$m) between the anode and the cathode. Herein, the term "organic EL element" encompasses the layers between the anode and cathode electrodes. Reducing the thickness lowered the resistance of the organic layer and enabled devices that operate at much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al (J. Applied Physics 1989, 65, 361 0). The light-emitting layer commonly consists of a host material doped with a guest material. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

Many emitting materials that have been described as useful in an OLED device emit light from their excited singlet state by fluorescence. The excited siniglet state is created when excitons formed in an OLED device transfer their energy to the excited state of the dopant. However, it is generally believed that only 25% of the excitons created in an EL device are singlet excitons. The remaining excitons are triplets, which cannot readily transfer their energy to the singlet-excited state of a dopant. A large loss in device performance efficiency results since 75% of the excitons are not used in the light emission process.

Triplet excitons can transfer their excited state energy to a dopant, if the dopant molecule's triplet excited state is sufficiently lower in energy. If the triplet state of the dopant is emissive, it can produce light by phosphorescence, wherein phosphorescence is a luminescence involving a change of spin state between the excited state and the ground state. In many cases singlet excitons can also transfer their energy to lowest singlet excited state of the same dopant molecule. The singlet excited state can often relax, by an intersystem crossing process, to produce the emissive triplet excited state. Thus, it is possible, by the proper choice of host and dopant, to collect energy from both the singlet and triplet excitons created in an OLED device and to produce a very efficient phosphorescent emission.

One class of usefull phosphorescent materials is transition metal complexes having a triplet-excited state. For example, fac-tris(2-phenylpyridinato-N,$C^{2'}$)iridium (III)(Ir(ppy)$_3$) strongly emits green light from a triplet excited state owing to the large spin-orbit coupling of the heavy atom and to the properties of the lowest excited state, which is a charge transfer state having a Laporte-allowed (orbital symmetry) transition to the ground state (K. A. King, P. J. Spellane, and R. J. Watts, J. Am. Chem. Soc. 1985, 107, 1431; M. G. Colombo, T. C. Brunold, T. Reidener, H. U. Gudel, M. Fortsch, and H.-B. Burgi, Inorg. Chem. 1994, 33, 545. Small-molecule, vacuum-deposited OLEDs having high efficiency have also been demonstrated with Ir(ppy)$_3$ as the phosphorescent material and 4,4'-N,N'-dicarbazole-biphenyl (CBP) as the host (M. A. Baldo, S. Lamansky, P. E. Burrows, M. E. Thompson, S. R. Forrest, Appl. Phys. Lett. 1999 4, 75, T. Tsutsui, M.-J. Yang, M. Yahiro, K. Nakamura, T. Watanabe, T. Tsuji, Y. Fukuda, T. Wakimoto, S. Miyaguchi, Jpn. J. Appl. Phys. 1999, 38, L1502).

Another class of phosphorescent materials include compounds having interactions between atoms having $d^{10}$ electron configuration, such as Au$_2$(dppm)Cl$_2$ (dppm=bis (diphenylphosphino)methane) (Y. Ma et al, Appl Phys. Lett. 1998, 74, 1361). Still other examples of useful phosphorescent materials include coordination complexes of the trivalent lanthanides such as Tb$^{3+}$ and Eu$^{3+}$(J. Kido et al, Appl. Phys. Lett. 1994, 65, 2124). While these latter phosphorescent compounds do not necessarily have triplet states as the lowest excited states, their optical transitions do involve a change in spin state of 1 and thereby can harvest the triplet excitons in OLED devices.

Although many phosphorescent Ir complexes have been described as usefull in an EL device, Pt-based organometallic complexes have not been examined as extensively. Some Pt-based phosphorescent complexes include cyclometallated Pt (II) complexes, such as cis-bis(2-phenylpyridinato-N,$C^{2'}$)platinum (II), cis-bis(2-(2'-thienyl) pyridinato-N,$C^{3'}$)platinum (II), cis-bis(2-(2'-thienyl) quinotinato-N,$C^{5'}$)platinum(II), (2-(4,6-difluorophenyl) pyridinato-N,$C^{2'}$)platinum (II) acetylacetonate, or (2-phenylpyridinato-N,$C^{2'}$)platinum (II) acetylacetonate. Pt (II) porphyrin complexes such as 2,3,7,8,12,13,17,18-octaethyl-21H, 23H-porphineplatinum (II) are reported in U.S. Pat. No. 6,048,630 as useful phosphorescent materials in an electroluminescent device, although they did not give a very high luminance yield. Recently, C.-M. Che, W. Lu, and M. Chan reported organometaflic light-emitting materials and devices based on (N^N^C) tridentate-cyclometalated Pt (II) acetylides (U.S. 2002/0179885 A1 and references cited therein).

It is a problem to be solved to provide new organometallic compounds that will function as phosphorescent materials having useful light emissions.

SUMMARY OF THE INVENTION

The invention provides an electroluminescent device comprising a cathode, an anode, and, located there between, a light emitting layer (LEL) containing a light emitting material that contains an organometallic complex comprising Pt or Pd metal and a tridentate (N^N^C) ligand, wherein the tridentate (N^N^C) ligand represents a ligand that coordinates to the metal through a nitrogen donor bond, a second nitrogen donor bond, and a carbon-metal bond, in that order, wherein at least one of the nitrogen donors is part of an aromatic ring or an imine group, and wherein the Pt or Pd atom also forms a bond to an anionic ligand group L, wherein L represents alkyl, alkenyl, aryl, or a cyano carbon, or halogen, or RX, wherein X represents a substituent that forms a bond to the Pt or Pd atom and wherein X represents N, O, S, or Se, and R represents a substituent.

DETAILED DESCRIPTION OF THE INVENTION

Figure 1:
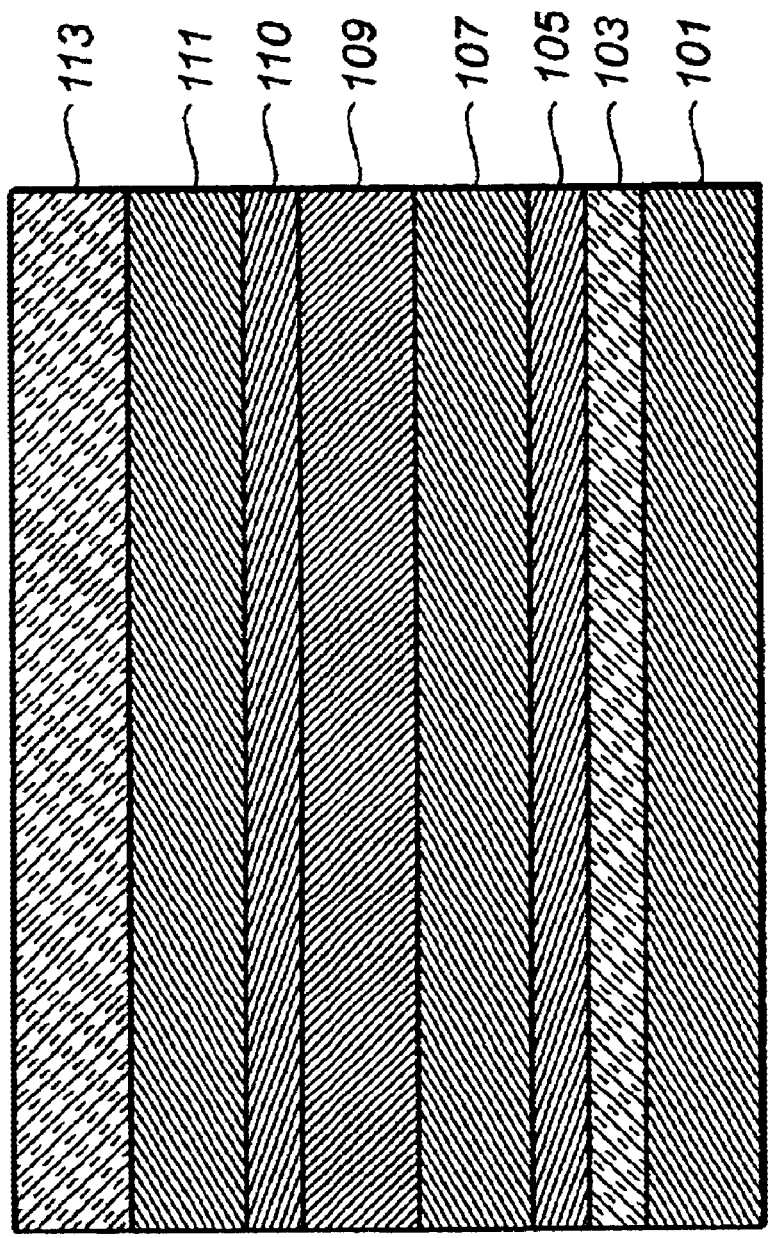
FIG. 1 shows a typical OLED device construction fabricated by vacuum thermal evaporative deposition useful in the practice of the invention.
Figure 2:
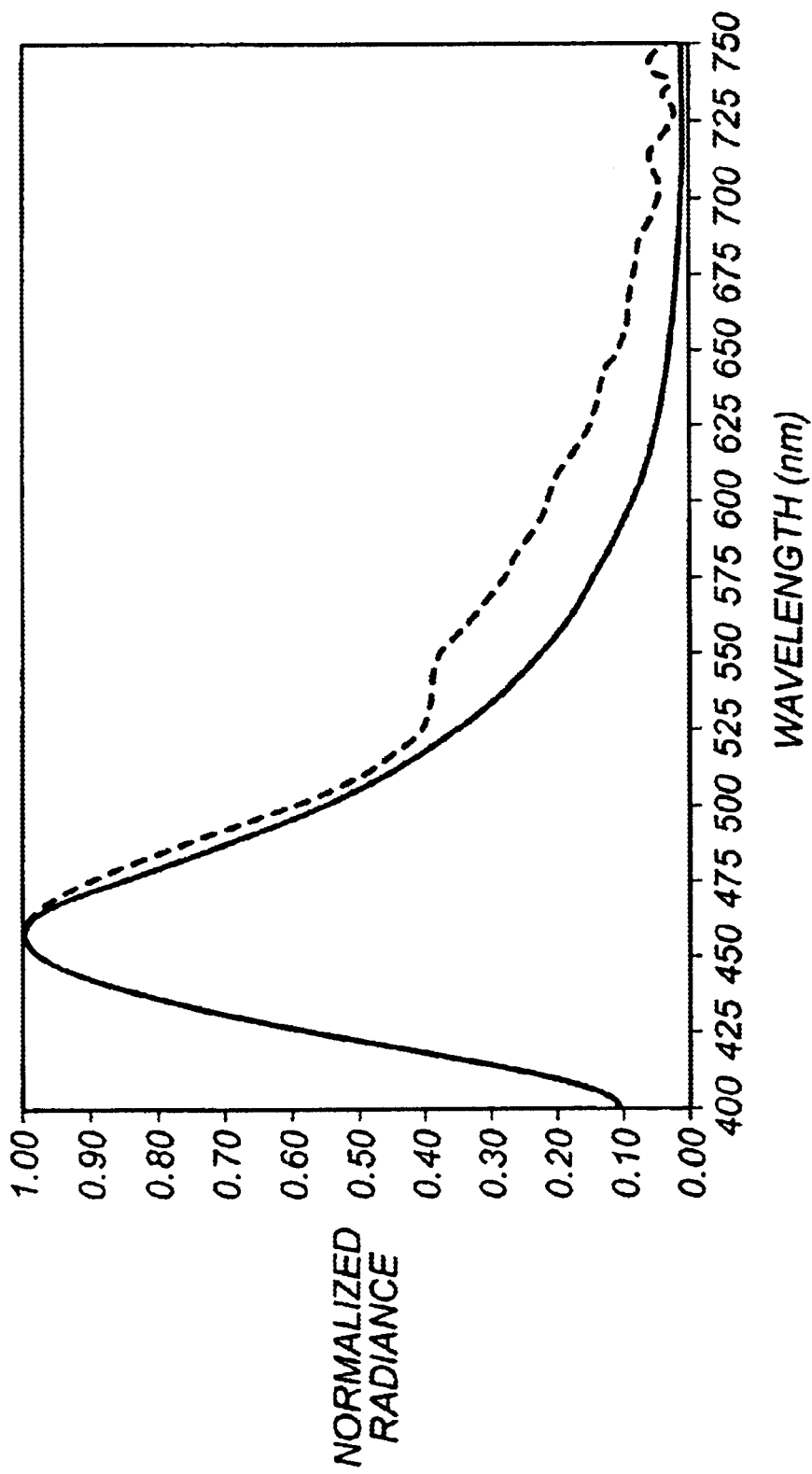
FIG. 2 shows the normalized electroluminescent radiance in the visible spectrum as a function of wavelength at 0.5 mA/cm$^2$ (dash line) and 100 mA/cm$^2$ (solid line) current density for Sample 101, comparative control device fabricated by vacuum thermal evaporative deposition, which lacks an added electrophosphorescent organometallic emitter complex.
Figure 3:
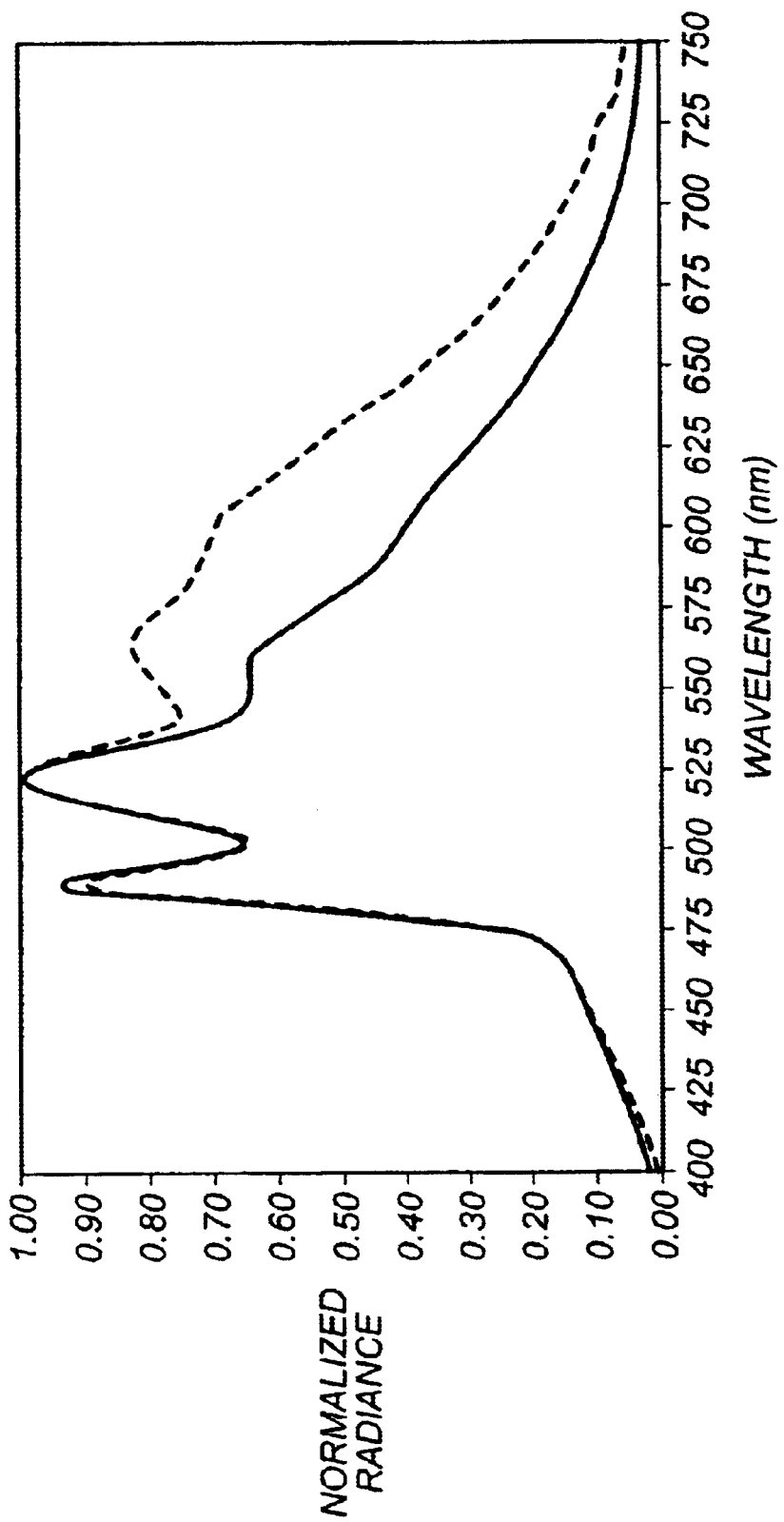
FIG. 3 shows the normalized electroluminescent radiance in the visible spectrum as a function of wavelength at 0.5 mA/cm$^2$ (dash line) and 100 mA/cm$^2$ (solid line) current density for Sample 104, comparative control device fabricated by vacuum thermal evaporative deposition, that is comprised of added electrophosphorescent organometallic emitter complex known in the art, ppyPtacac [(2-phenylpyridinato-N,C$^{2'}$)platinum (II) acetylacetonate].
Figure 4:
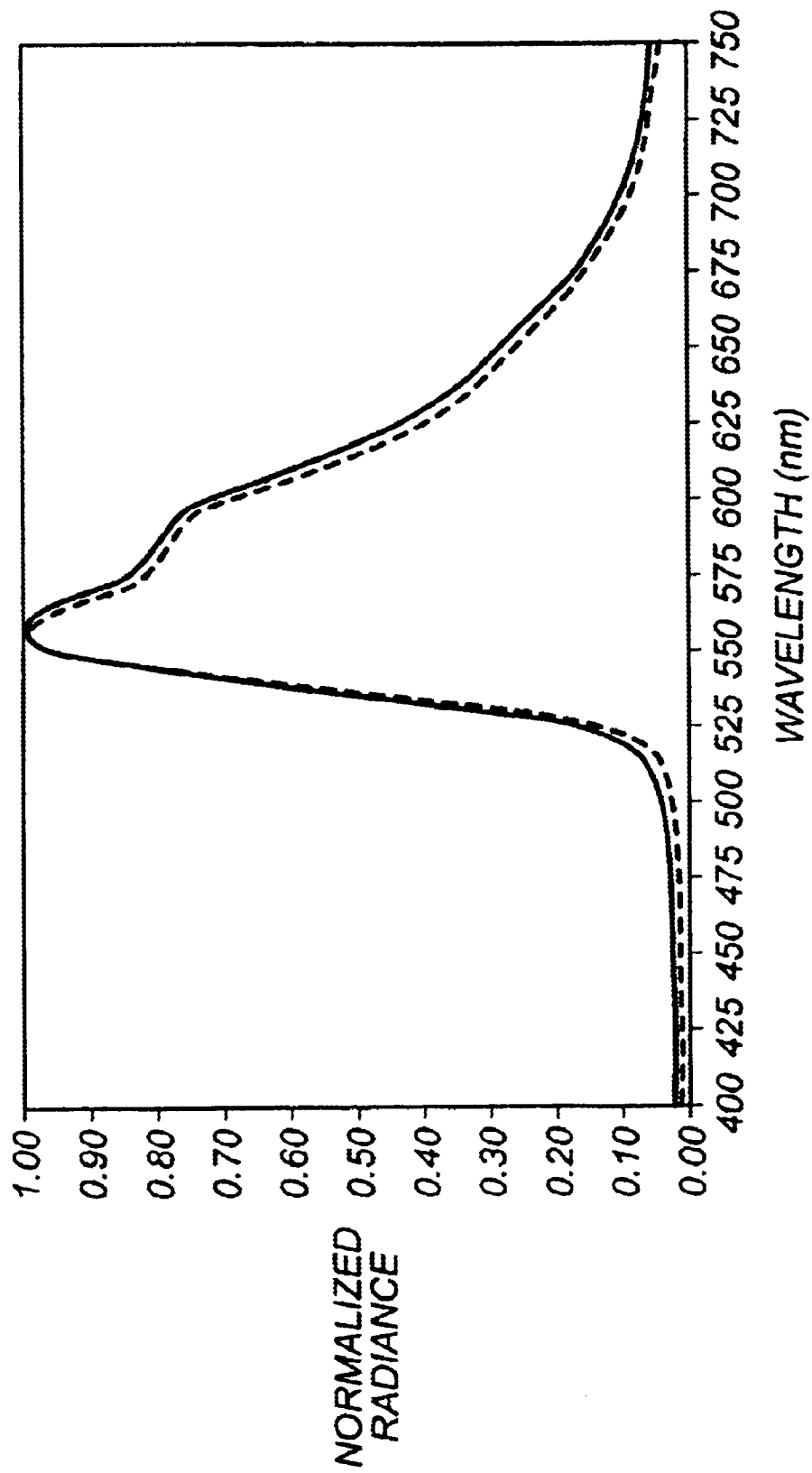
FIG. 4 shows the normalized electroluminescent radiance in the visible spectrum as a function of wavelength at 0.5 mA/cm$^2$ (dash line) and 100 mA/cm$^2$ (solid line) current density for Sample 106, example device fabricated by vacuum thermal evaporative deposition, which is comprised of added electrophosphorescent organometallic emitter complex, Inv.-1.
Figure 5:
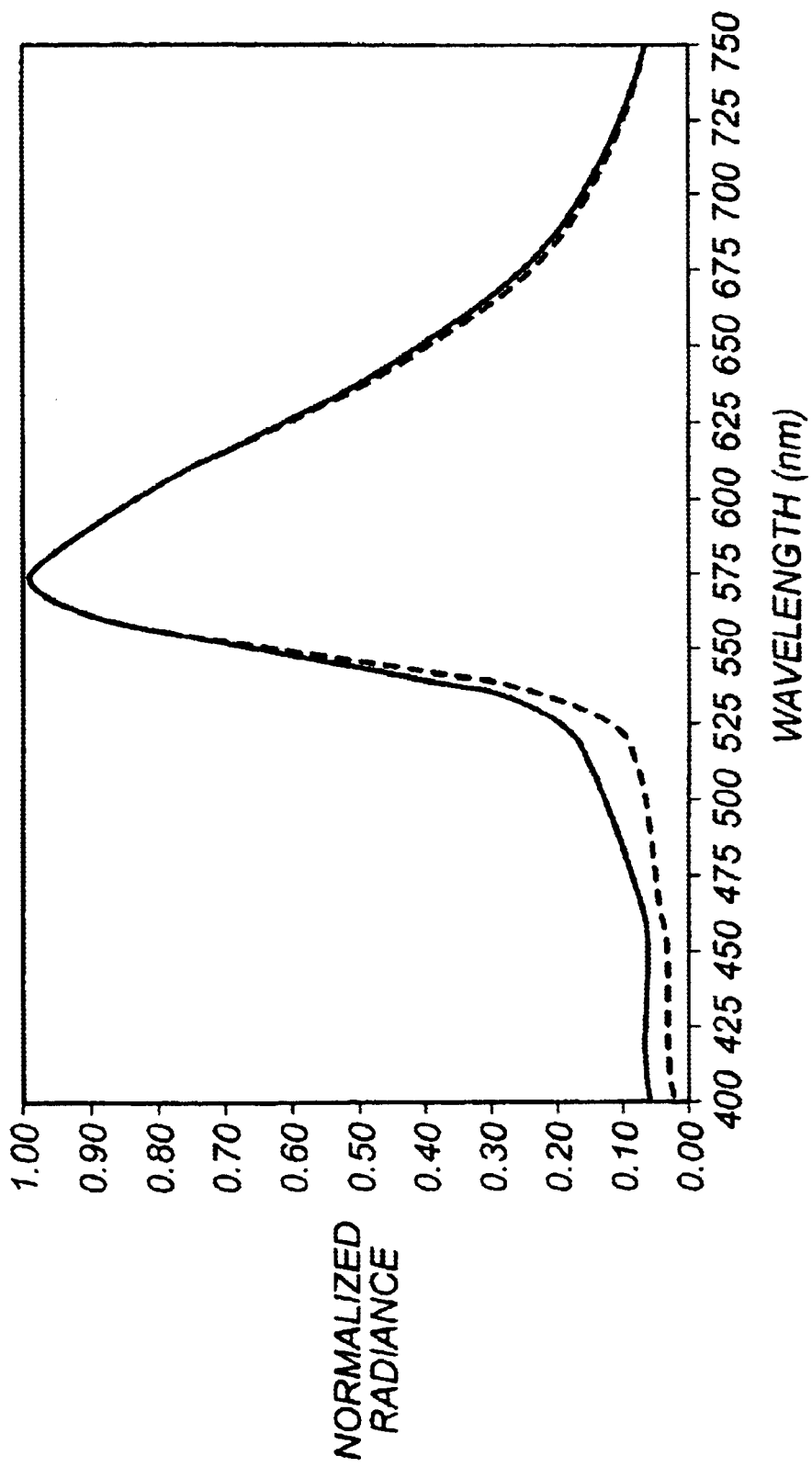
FIG. 5 shows the normalized electroluminescent radiance in the visible spectrum as a function of wavelength at 0.5 mA/cm$^2$ (dash line) and 100 mA/cm$^2$ (solid line) current density for Sample 109, example device fabricated by vacuum thermal evaporative deposition, which is comprised of added electrophosphorescent organometallic emitter complex, Inv.-2.
Figure 6:
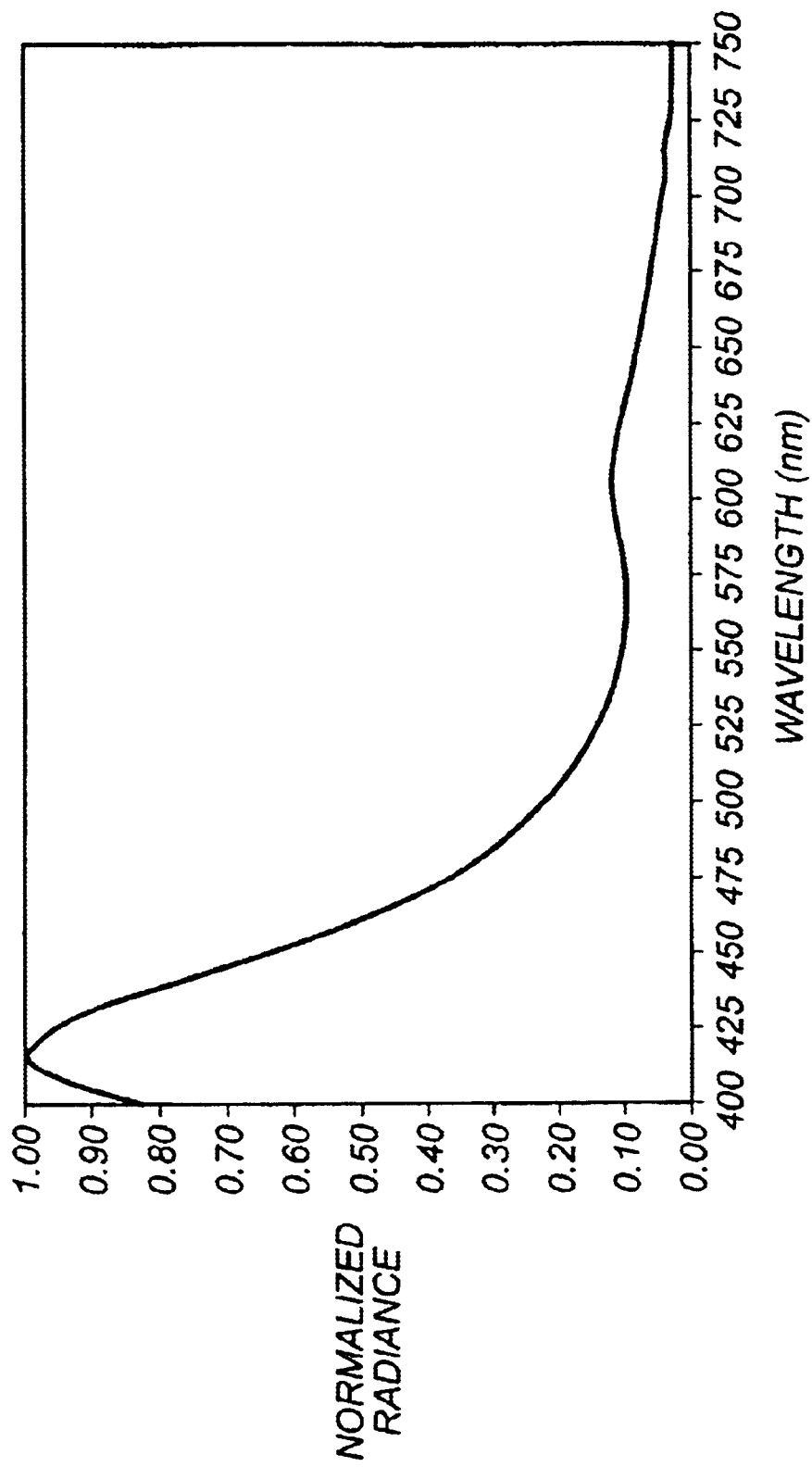
FIG. 6 shows the normalized electroluminescent radiance in the visible spectrum as a function of wavelength at 100 mA/cm$^2$ current density for Sample 201, comparative control device fabricated by solution processing, which lacks an added electrophosphorescent organometallic emitter complex.
Figure 7:
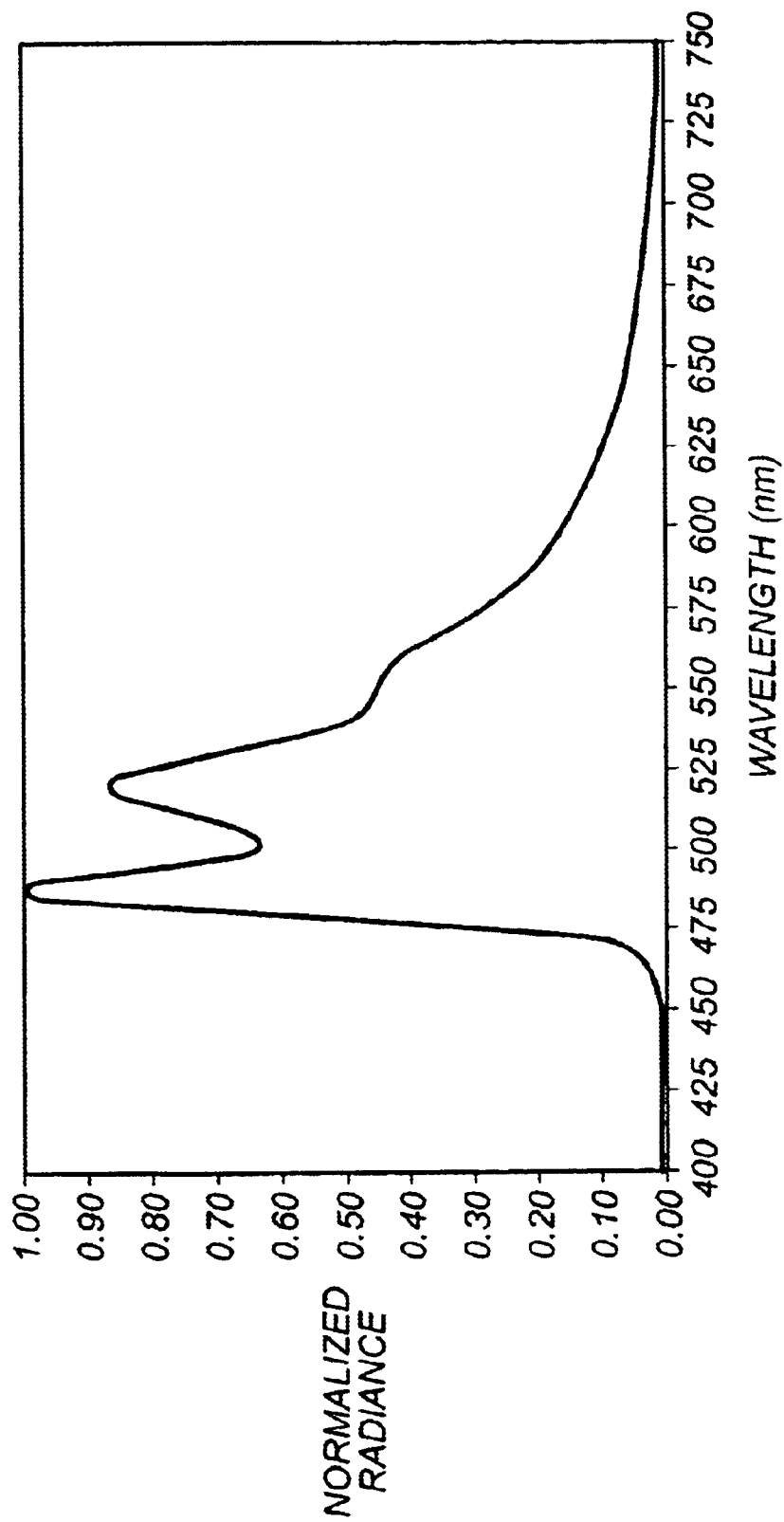
FIG. 7 shows the normalized electroluminescent radiance in the visible spectrum as a function of wavelength at 100 mA/cm$^2$ current density for Sample 202, comparative control device fabricated by solution processing, that is comprised of added electrophosphorescent organometallic emitter complex known in the art ppyPtacac [(2-phenylpyridinato-N,C$^{2'}$)platinum (II) acetylacetonate].
Figure 8:
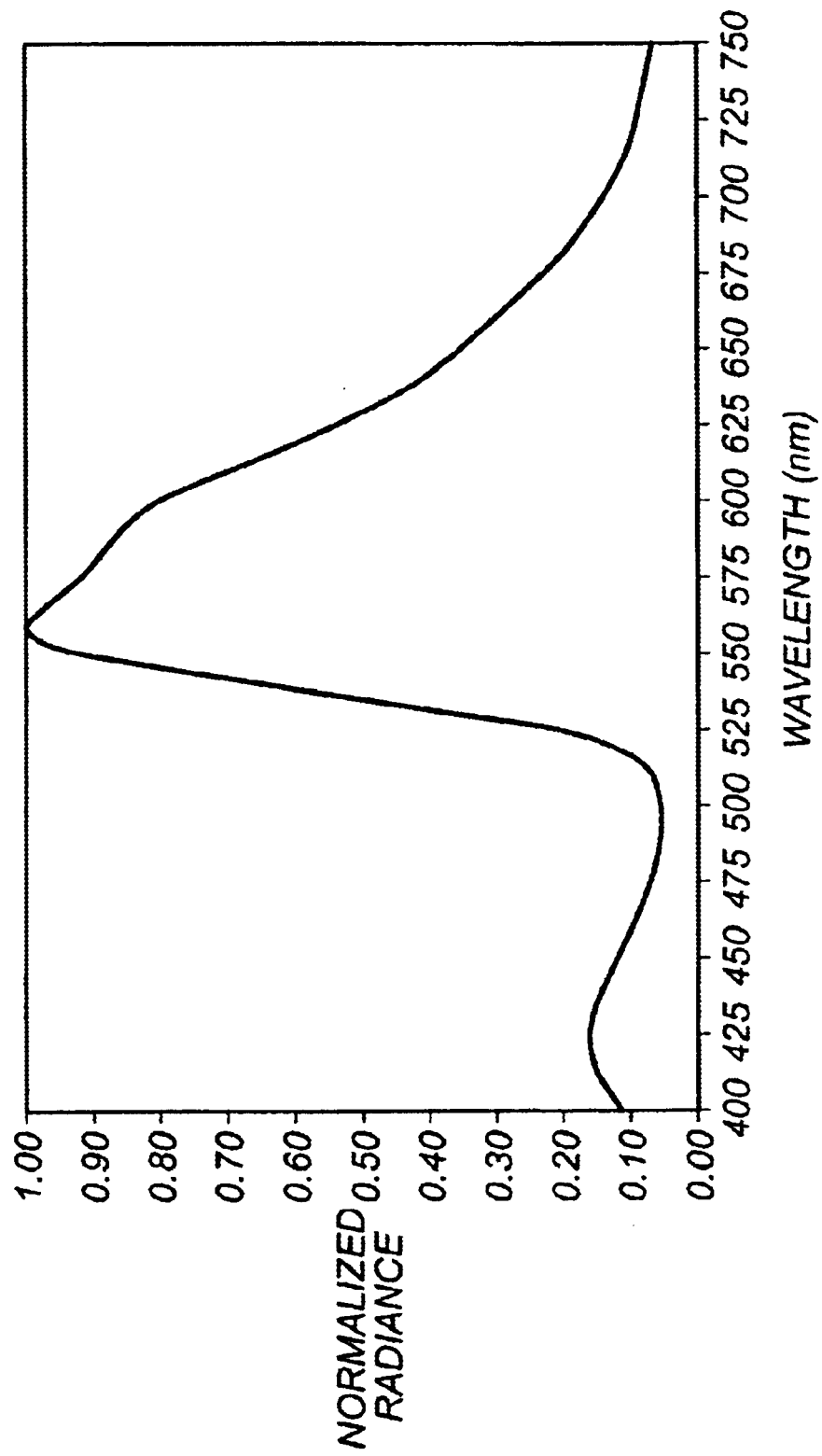
FIG. 8 shows the normalized electroluminescent radiance in the visible spectrum as a function of wavelength at 100 mA/cm$^2$ current density for Sample 203, example device fabricated by solution processing, which is comprised of added electrophosphorescent organometallic emitter complex, Inv.-1.
Figure 9:
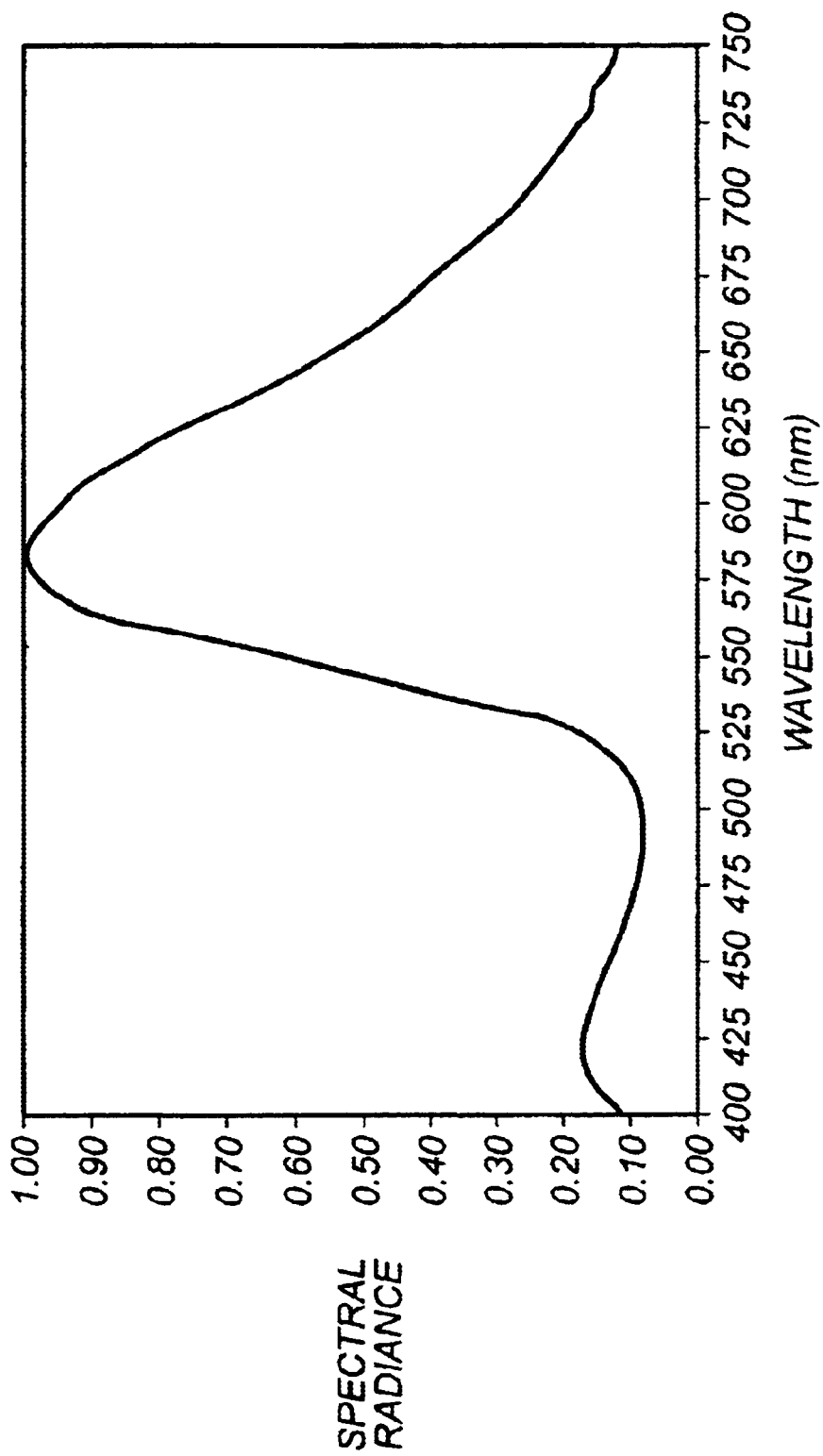
FIG. 9 shows the normalized electroluminescent radiance in the visible spectrum as a function of wavelength at 100 mA/cm$^2$ current density for Sample 204, example device fabricated by solution processing, which is comprised of added electrophosphorescent organometallic emitter complex, Inv.-2.

The invention is summarized aove. The organometallic compound of the invention comprises Pt or Pd metal, more desirably Pt. In desirable embodiments of the invention, the oxidation state of the metal is +2, although valence states of +4 are specifically contemplated. The metal forms a complex with a tridentate (N^N^C) ligand, wherein the tridentate (N^N^C) ligand represents a ligand molecule that coordinates to the metal through two nitrogen donor bonds, and a carbon bond, in that order, wherein at least one of the nitrogen donor atoms is part of an aromatic ring or an imine group. The tridentate ligand bears a formal negative charge localized at the site of a metal-carbon bond. As the multidentate-ligand forms a ring system with the central metal atom in the organometallic complex, the ligand is said to be cyclometallated. Examples of suitable ligands are shown below. Desirably, both of the nitrogen donor atoms are part of an aromatic ring.

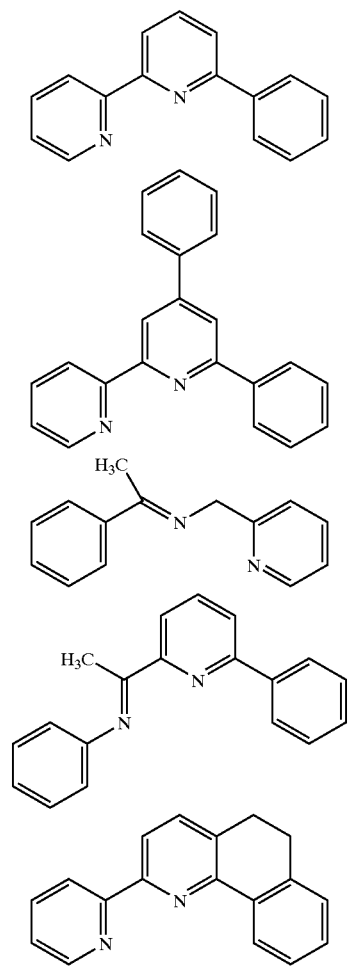

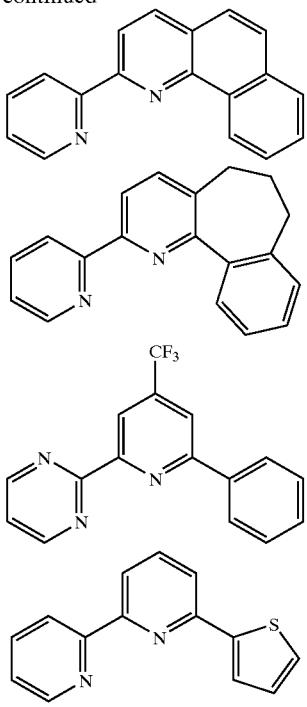

In one suitable embodiment, the tridentate ligand-bearing organometallic complex can be incorporated into a polymer light emitting diode (PLED) device, preferably fabricated using solution processing. For example, the organometallic complex can be part of the main chain of a polymer, the side chain of a polymer, or it can be intermixed with a polymer in such a device.

In one desirable embodiment the organometallic compound can be represented by Formula (1a), (1a)

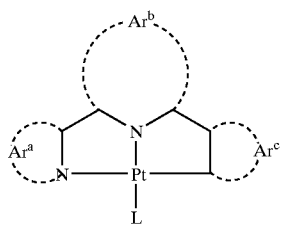

wherein:

Ar$^a$, Ar$^b$, and Ar$^c$ independently represent the atoms necessary to form a five- or six-membered aromatic ring, which may be further substituted, including substitution by fused rings. The term 'aromatic rings' includes aromatic rings that have heteroatoms present in the ring; see for example, J. March, *Advanced Organic Chemistry*, Chapter 2 (1985, publisher John Wiley & Sons, New York, N.Y.). For example, Ar$^c$ can represent the atoms necessary to form groups such as benzene ring groups, thiophene ring groups, or furan ring groups. Likewise, Ar$^a$ and Ar$^b$ can represent the atoms necessary to form groups such as pyridine ring groups, quinoline ring groups, isoquinoline ring groups, and indole ring groups, as examples. In one desirable embodiment, Ar$^c$ represents a benzene ring group and Ar$^a$ and Ar$^b$ independently represent pyridine ring groups.

L represents a ligand atom or molecule bearing a negative charge. In the L-M metal bond, where M represents the metal atom of the organometallic complex, more of the electron density is localized on L, the ligand; the L-M bond may be ionic or covalent in character. For example, L can represent a halogen atom that is fluoride, chloride, bromide, or iodide. L can also be chosen so that it forms a carbon-metal bond in the organometallic complex; for example, L can represent a cyanide group, an aryl group, a cyclopent-dienyl group, a vinyl, group, an allyl group, or an alkyl group. Illustrative examples of such L groups are shown below:

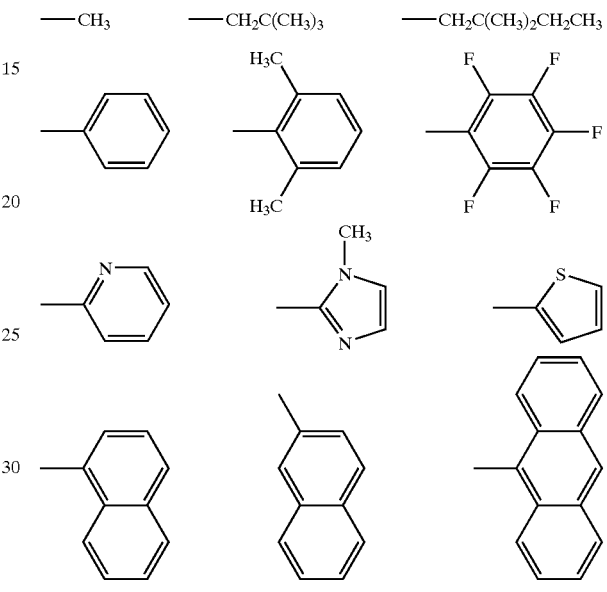

It is appreciated that transition metal organometallic complexes useful in the practice of the invention are subject to decomposition pathways at high temperatures by ligand hydrogen abstraction and ligand reductive elimination pathways. Suitable selection of alkyl-based ligands can mitigate against such undesirable effects. Desired alkyl groups directed at high thermal stability suitable for vacuum sublimation and vacuum thermal evaporative deposition method of device fabrication include methyl-, neopentyl-(2, 2-dimethylpropyl-), and neohexyl-(2,2-dimethylbutyl-). Useful vinyl substituents include 2-ethenyl-. It is especially desirable that L be aryl. Desired aryl substituents include phenyl-, naphthyl-, and anthracenyl-, especially 9-anthracenyl. The compounds of the invention are suitable for inclusion in polymer- or oligomer-based organic light emitting diodes prepared by solution processing (e.g., spin coating or ink jet printing). The aforementioned complexes where L is an alkyl group are particularly well suited to this application, and alkyl groups containing A-hydrogen atoms, such ethyl-, propyl-, butyl-, hexyl-, norbornyl-, and so forth, and various alkyl substituted forms, are also useful. When the valence of the transition metal atom permits, the alkyl group may form a ring with the metal, such a metallacyclopropane, a metallacyclobutane, or a metallacyclopentane; the latter ring size is desired.

L can also represent RX, wherein X forms a bond to the metal (Pt or Pd) and wherein X represents N, O, S, or Se, and R represents a substituent. For example, R can represent an aryl group or an alkyl group or a carbonyl group or sulfonyl group. Suitable examples of groups represented by RX are thiocyanate, alkoxide or aryloxide groups, amido group,s alkyl sulfide or aryl sulfide groups, a carboxlate group or sulfonate group. Illustrative examples of RX are also given below.

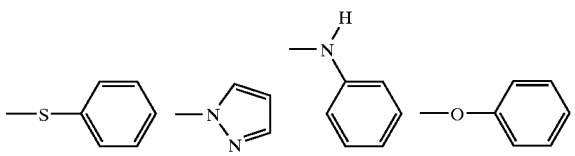

In one desirable embodiment the organometallic complex of the invention can be represented by Formula (1b):

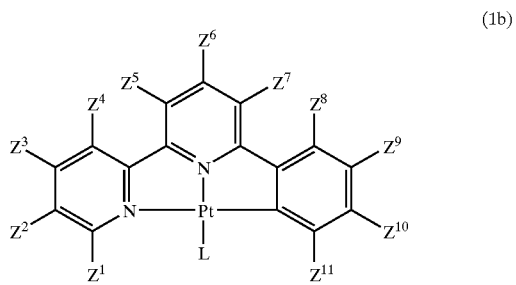

(1b)

$Z^1$–$Z^{11}$ of formula (1b) represent hydrogen or independently selected substituent groups, provided that adjacent substituent groups can combine to form rings. Examples of substituents are phenyl groups, alkyl groups such as methyl groups or t-butyl groups. $Z^4$ and $Z^5$ as well as $Z^7$ and $Z^8$ can also combine to form rings; for example, a 6-membered saturated ring or a 6-membered aromatic ring. L represents an anionic ligand.

In another desirable embodiment the organometallic complex can be represented by Formula (1c):

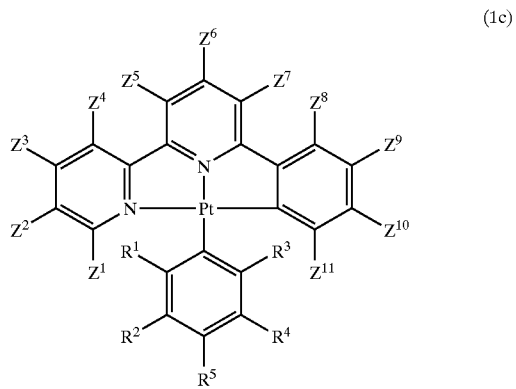

(1c)

As described above, $Z^1$–$Z^{11}$ represent hydrogen or independently selected substituent groups, provided that adjacent substituent groups can combine to form rings, and provided that $Z^4$ and $Z^5$ as well as $Z^7$ and $Z^8$ can combine to form rings.

$R^1$–$R^5$ represent hydrogen or independently selected substituents, provided that adjacent substituents may combine to form a ring group, which may be further substituted including substitution by fused rings. For example, $R^1$ and $R^3$ can independently represent groups such as methyl groups or isopropyl groups. $R^1$ and $R^2$, and $R^3$ and $R^4$ can combine to form rings such as benzene ring groups or tolyl ring groups. It one desirable embodiment, $R^1$ and $R^3$ are methyl groups.

Synthetic Method

Synthesis of the emitting materials useful in the invention may be accomplished by separately preparing the organic tridentate ligand, and then forming an organometallic complex by conducting a ligand displacement reaction on a suitable Pt (II) salt, followed by in situ cyclometallation. Additional complexes can be generated from such precursor [(N^N^C)Pt (II)] halide complexes of the invention using conventional organometallic reagents, such as alkyl-, vinyl-, or aryl-Grignard reagents or lithium reagents. Suitable tridentate ligands and their metal complexes can be prepared by various methods reported in the literature. Methods useful in the preparation of representative (N^N^C) ligands (e.g., 4-phenyl-2,2'-bipyridine) are described in the following articles: Kröhnke, F. Synthesis 1976, 1; Kaufmann, T.; König, J.; Woltermann, A. Chem. Ber. 1976, 109, 3864; Jahng, Y.; Park, J. G. Inorg. Chim. Acta 1998, 267, 265; Neve, F.; Crispini, A.; Campagna, S. Inorg. Chem. 1997, 36, 6150; Constable, E. C.;. An exemplary synthetic method (Rxn-1) involves the reaction of 2,2'-bipyridine with phenyllithium to yield an addition product, followed by oxidation with manganese dioxide, to produce 4-phenyl-2,2'-bipyridine. Alternatively, intermediary 1,5-diketones, formed by Micheal condensations of methylketone pyridinium salts with α, β-unsaturated ketones, can be cyclized in situ using ammonium acetate and acetic acid/methanol solvents to produce oligopyridines (Rxn-2). Halide ligand displacement of tetrahaloplatinate salt by (N^N^C), followed by cyclometallation under the conditions of the reaction, to yield [(N^N^C)Pt (II)] halide is reported as follows: Hofmann, A.; Dahlenburg, L.; van Eldik, R. Inorg. Chem. 2003, 42, 6528; Neve, F.; Crispini, A.; Campagna, S. Inorg. Chem. 1997, 36, 6150; Constable, E. C.; Cheung, T.-C.; Cheung, K.-K; Peng, S.-M.; Che, C.-M. J. Chem. Soc., Dalton Trans. 1996, 1645; Constable, E. C. Henney, R. P. G.; Raithby, P. R.; Sousa, L. R. J. Chem. Soc., Dalton Trans. 1992, 2251; Constable, E. C.; Henney, R. P. G.; Leese, T. A.; Tocher, D. A. J. Chem. Soc., Chem. Dalton Trans. 1990, 443. The related preparation of [(N^N^C) Pd (II)] halides is described in Lai, S.-W.; Cheung, T.-C.; Chan, M.; Cheung, K.-K.; Peng, S. M.; Che, C.-M. Inorg. Chem. 2000, 39, 255; Neve, F.; Crispini, A.; Campagna, S. Inorg. Chem. 1997, 36, 6150; Constable, E. C. Henney, R. P. G.; Raithby, P. R.; Sousa, L. R. J. Chem. Soc., Dalton Trans. 1992, 2251; Constable, E. C.; Henney, R. P. G.; Leese, T. A.; Tocher, D. A. J. Chem. Soc., Chem. Commun. 1990, 513; Constable, E. C.; Henney, R. P. G.; Leese, T. A.; Tocher, D. A. J. Chem. Soc., Chem. Dalton Trans. 1990, 443. The preparation of Pt-F and Pd-F bonds is reported in the following articles, and references contained therein: Yahav, A; Goldberg, I.; Vigalok, A. J. Am. Chem. Soc. 2003, 125, 13634; Marshall, W. J.; Thorn, D. L.; Grushin, V. V. Organometallics 1998, 17, 5427; Pilon, M. C; Grushin, V. V. Organometallics 1998, 17, 1774; Clark, H. C. S.; Fawcett, J.; Holloway, J. H.; Hope, E. G.; Peck, L. A.; Russell, D. R. J. Chem. Soc., Dalton Trans. 1998, 1249; Fraser, S. L.; Antipin, A. Y.; Khroustalyov, V. N.; Grushin, V. V. J. Am Chem. Soc. 1997, 119, 4769. Rxn-3 illustrates the preferred use of acetic acid as solvent. The preparation of neutral, mononuclear arylPt (II) ligand complexes (Rxn-4, wherein $Ar^s$ represents a five- or six-membered aromatic ring group bonded to Pt, and $Ar^w$ and $Ar^Y$ represent the atoms necessary to complete a five- or six-membered ring aromatic group) or alkylPt (II) ligand complexes (Rxn-5, wherein, $Ar^w$ and $Ar^Y$ represent the atoms necessary to complete a five- or six-membered ring aromatic group) by the reaction of aryllithium or arylmagnesium bromide, or alkyllithium or alkylmagnesium bromide, respectively, with platinum (II) ligand halide complexes is well known and representative reactions are described in the following article, and references contained therein: Miller, T. M.;

Izurni, A. N.; Shih, Y.-S.; Whitesides, G. M. *J. Am. Chem. Soc.* 1988, 110, 3146. Other organometallic derivatives (e.g., Pt-vinyl) can be prepared in analogous ways using procedures known to those skilled in the art.
Illustrative examples of complexes of Formula (1) useful in the present invention are the following:
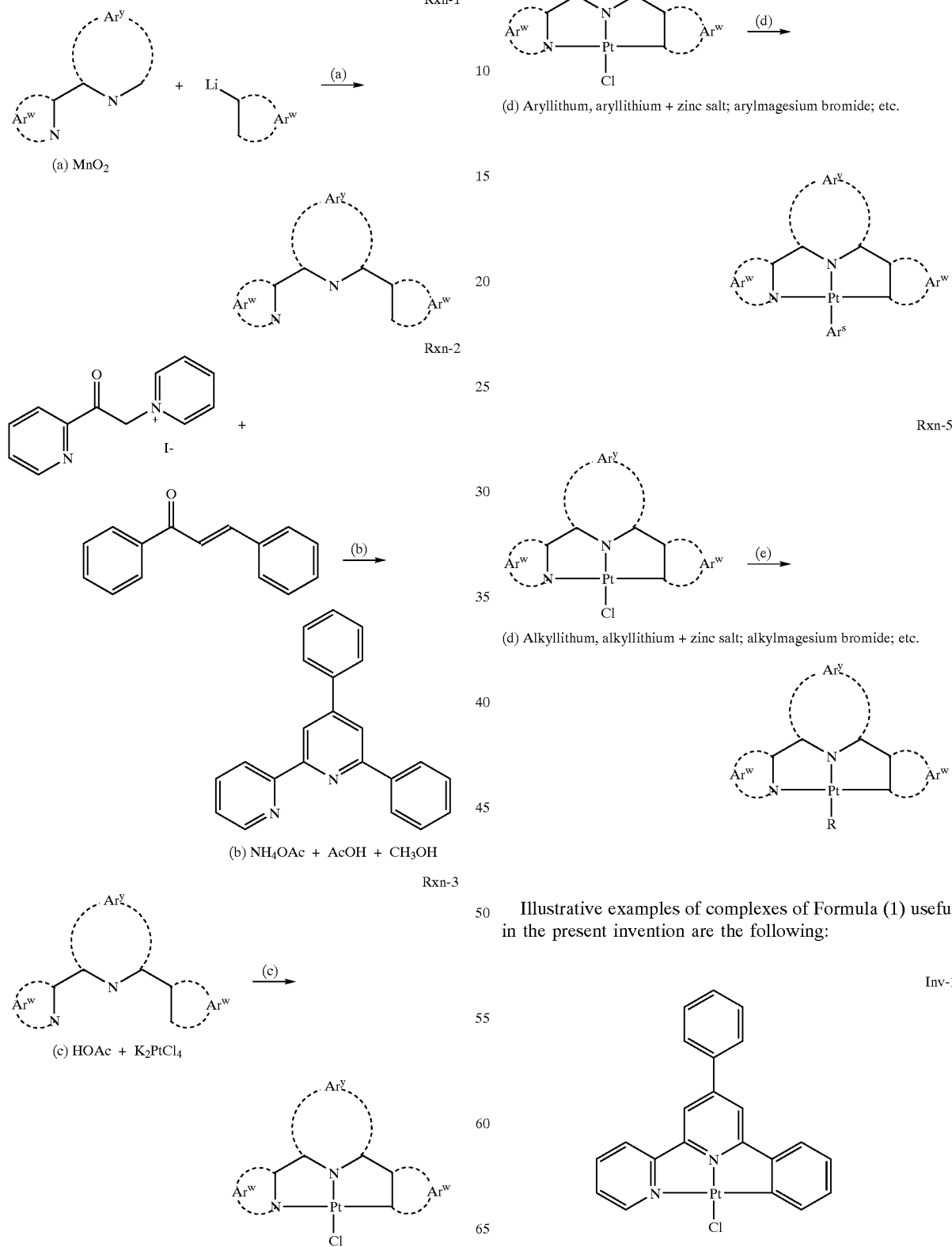

-continued
Inv-2
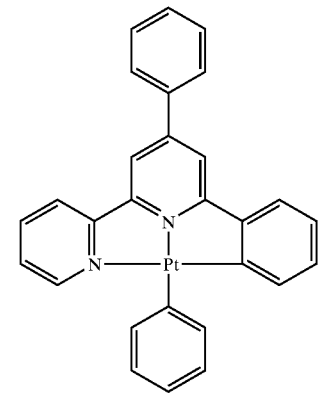
Inv-3
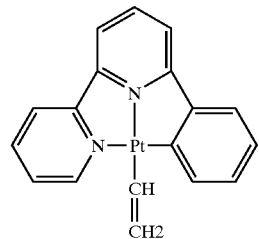
Inv-4
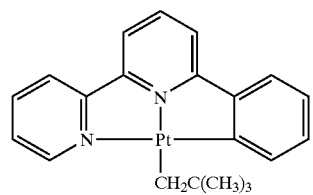
Inv-5
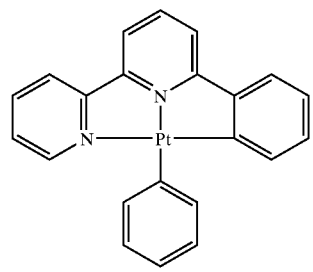
Inv-6
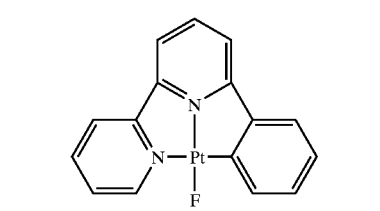
Inv-7
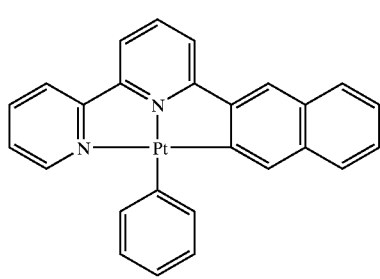
-continued
Inv-8
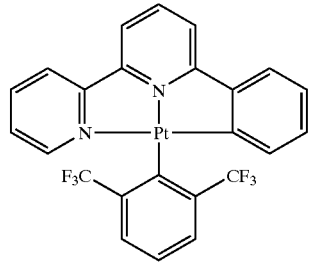
Inv-9
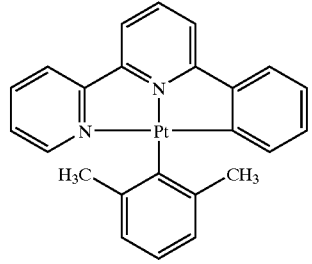
Inv-10
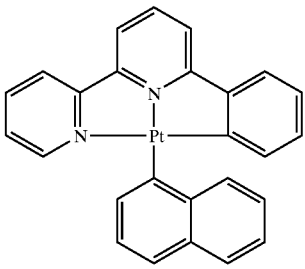
Inv-11
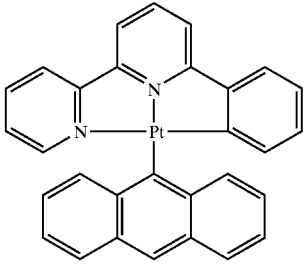
Inv-12
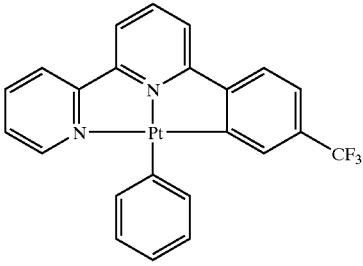

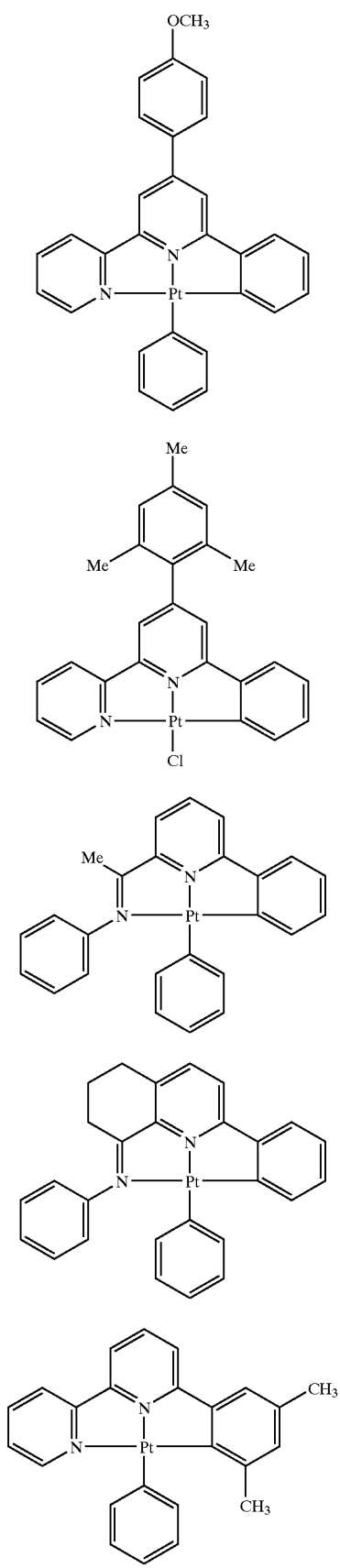
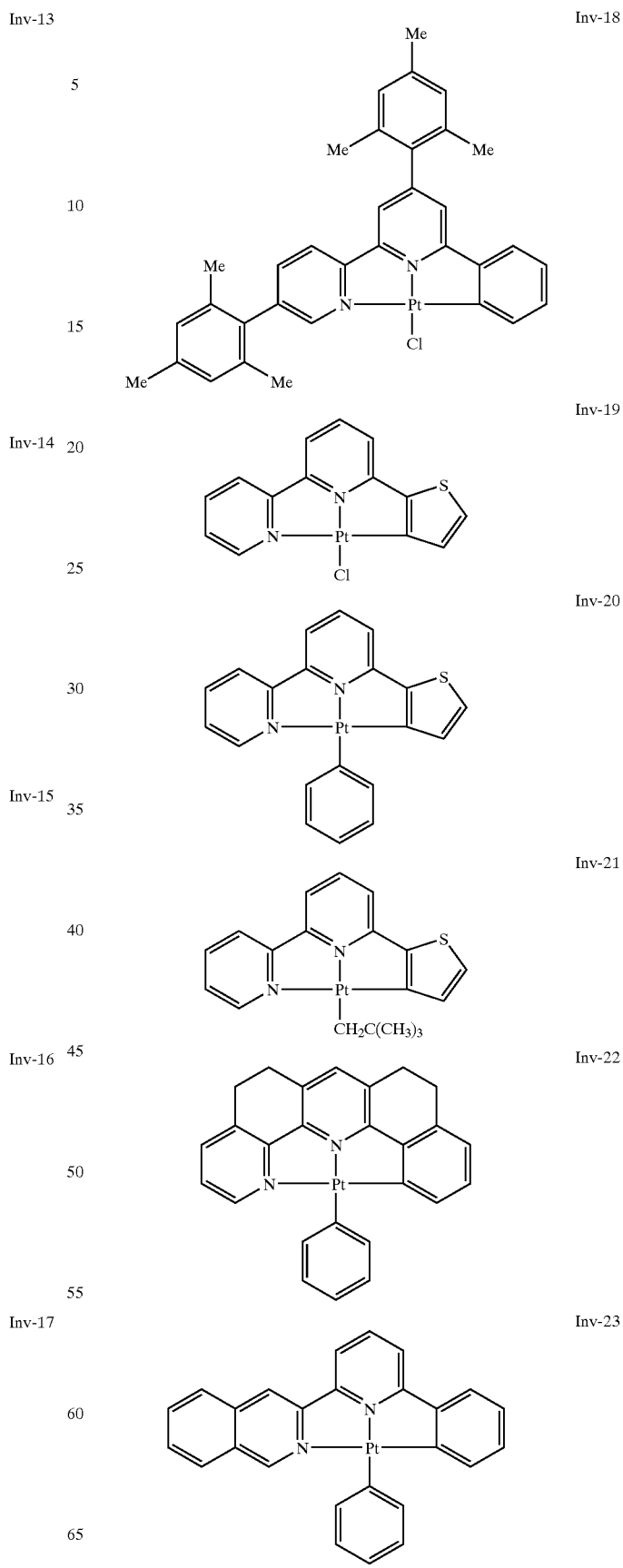

-continued
Inv-24
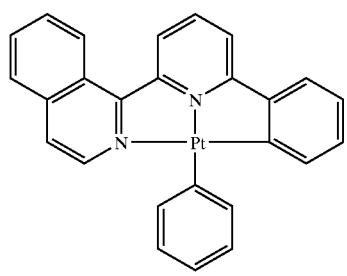
Inv-25
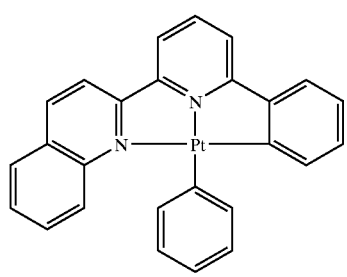
Inv-26
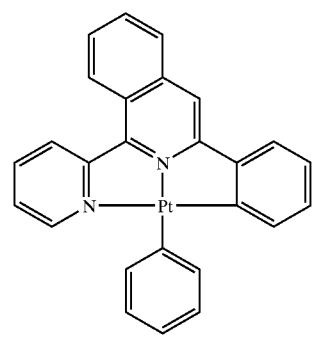
Inv-27
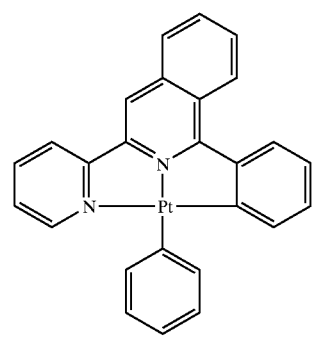
Inv-28
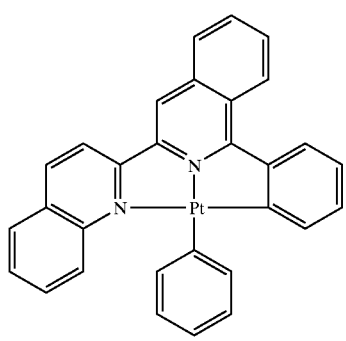
-continued
Inv-29
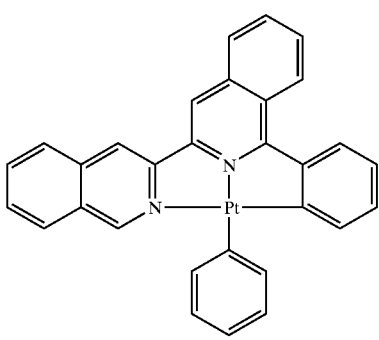
Inv-30
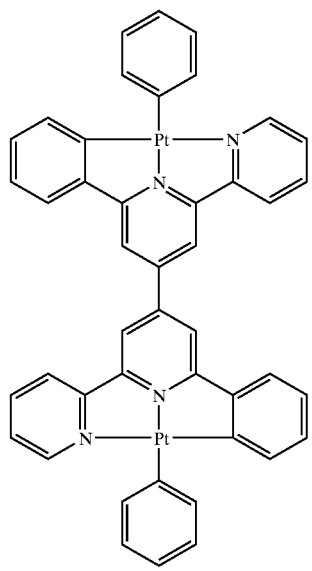
Inv-31
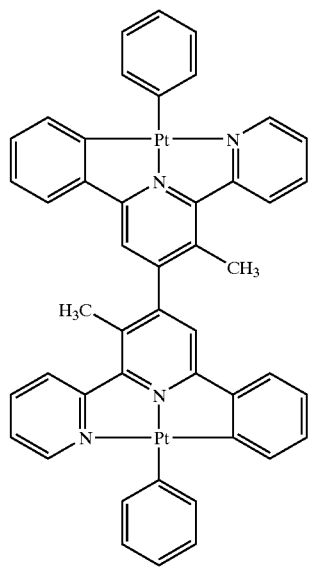

Inv-32
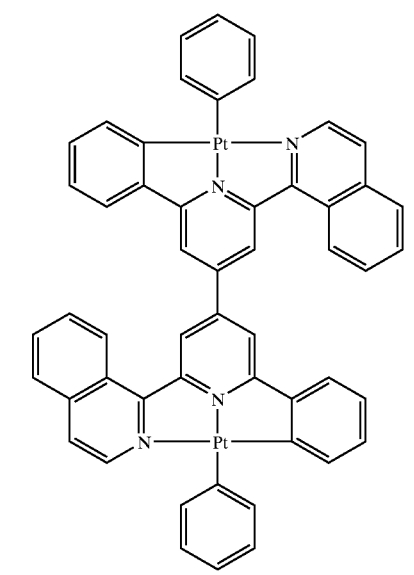
Inv-33
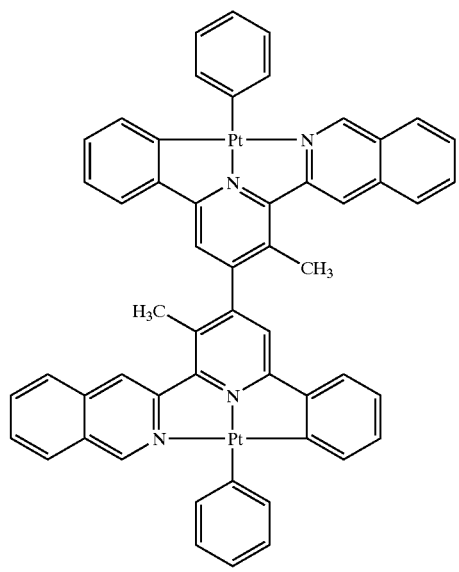
Inv-34
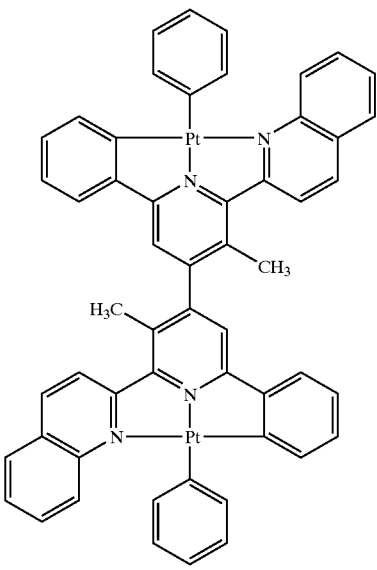
Inv-35
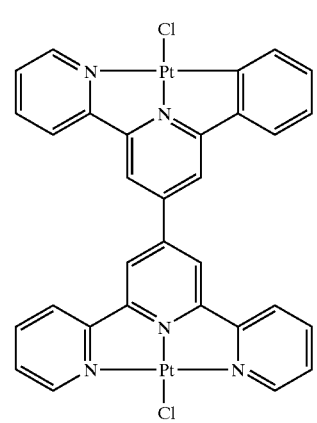
Inv-36
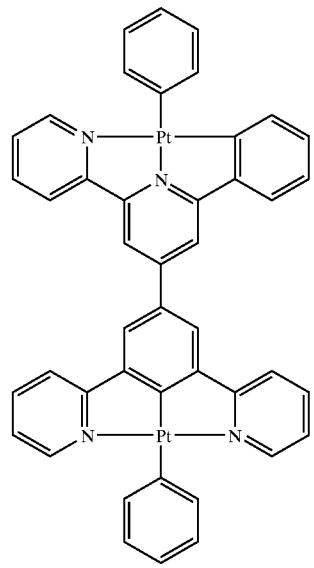

Unless otherwise specifically stated, use of the term "substituted" or "substituent" means any group or atom other than hydrogen. Unless otherwise provided, when a group (including a compound or complex) containing a s substitutable hydrogen is referred to, it is also intended to encompass not only the unsubstituted form, but also form further substituted derivatives with any substituent group or groups as herein mentioned, so long as the substituent does not destroy properties necessary for utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethenyl, 2-butenyl; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy) ethoxy, and 2-dodecyloxyethoxy, aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy, carbonamido, such as acetamido, benzamido, butyramido, tetradecanamido, alpha-(2,4-di-t-pentyl-phenoxy)acetamido, alpha-(2,4-di-t-pentylphenoxy) butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycabonylanino, hexadecyloxycarbonylamino, 2,4-di-t-butylphenoxycarbonylamino, phenylcarbonylamino, 2,5-di-t-pentylphenyl)carbonylamino, p-dodecylphenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesalfonamido, N-methyltetradecylsulfonamido, N,N-dipropylsulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, pdodecyloxyphenoxycarbonyl methoxycarbonyl, butoxycarbonyl, tetradecyloxycabonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy, sulfinyl, such as methylsulfinyl, octylsulfinyl, 2-ethylhexylsulfinyl, dodecelsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy) ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamino, dodecylamino; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron, such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and groups that produce steric effects. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

Suitably, the light-emitting layer of the OLED device comprises a host material and one or more guest materials for emitting light. At least one of the guest materials is suitably a phosphorescent complex comprising a ring system of Formula 1a. The light-emitting guest material(s) is usually present in an amount less than the amount of host materials and is typically present in an amount of up to 15 wt % of the host, more typically from 2–10.0 wt % of the host. For convenience, the phosphorescent complex guest material may be referred to herein as a phosphorescent material. The phosphorescent material of Formula 1a is preferably a low molecular weight compound, but it may also be an oligomer or a polymer having a main chain or a side chain of repeating units having the moiety represented by Formula 1a. It may be provided as a discrete material dispersed in the host material, or it may be bonded in some way to the host material—for example, covalently bonded into a polymeric host.

Host Materials for Phosphorescent Materials

Suitable host materials should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host However, the band gap of the host should not be chosen so large as to cause an unacceptable increase in the drive voltage of the OLED. Suitable host materials are described in WO 00/70655 A2; 01/39234 A2; 01/93642 A1; 02/074015 A2; 02/15645 A1, and U.S. 20020117662. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-N,N'-dicarbazole-biphenyl, m-(N,N'- dicarbazole)benzene, and poly(N-vinylcarbazole) (PVK), including their derivatives.

Desirable host materials are capable of forming a continuous film. The light-emitting layer may contain more than one host material in order to improve the device's film morphology, electrical properties, light emission efficiency, and lifetime. The light-emitting layer may contain a first host material that has good hole-transporting properties, and a second host material that has good electron-transporting properties.

Other Phosphorescent Materials

Phosphorescent materials of Formula 1a may be used alone or in combination with other phosphorescent materials, either in the same or in different layers. Some other phosphorescent materials are described in WO 00/57676, WO 00/70655, WO 01/41512 A1, WO 02/15645 A1, US 2003/0017361 A1, WO 01/93642 A1, WO 01/39234 A2, U.S. Pat. No. 6,458,475 B1, WO 02/071813 A1, U.S. Pat. No. 6,573,651 B2, US 2002/0197511 A1, WO 02/074015 A2, U.S. Pat. No. 6,451,455 B1, US 2003/0072964 A1, US 2003/0068528 A1, U.S. Pat. No. 6,413,656 B1, U.S. Pat. No. 6,515,298 B2, U.S. Pat. No. 6,451,415 B1, U.S. Pat. No. 6,097,147, US 2003/0124381 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, US 2003/0141809 A1, US 2003/0040627 A1, JP 2003059667A, JP 2003073665A, and US 2002/0121638 A1.

The emission wavelengths of cyclometallated Ir(III) complexes of the type $IrL_3$ and $IrL_2L'$, such as the green-emitting fac-tris(2-phenylpyridinato-N,$C^{2'}$)iridium (III) and bis(2-phenylpyridinato-N,$C^{2'}$)iridium (III) (acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl)pyridinato-N, $C^{3'}$)iridium (III) (acetylacetonate) and tris(1-phenylisoquinolinato-N,C)iridium (III). A blue-emitting example is bis(2-(4,6-difluorbphenyl)-pyridinato-N,$C^{2'}$) iridium (III)(picolinate).

Red electrophosphorescence has been reported, using bis(2-(2'-benzo[4,5-a]thienyl)pyridinato-N,$C^{3'}$) iridium (acetylacetonate) [$Btp_2Ir(acac)$] as the phosphorescent material (Adachi, C.; Lamansky, S.; Baldo, M. A.; Kwong, R. C.; Thompson, M. E.; and Forrest, S. R. *App: Phys. Lett.* 2001, 78, 1622.

Still other examples of useful phosphorescent materials include coordination complexes of the trivalent lanthanides such as $Tb^{3+}$ and $Eu^{3+}$(Kido, J. et al *Appl. Phys. Left.* 1994, 65, 2124.

Blocking Layers

In addition to suitable hosts, an OLED device employing a phosphorescent material often requires at least one exciton or hole or electron-blocking layer to help confine the excitons or electron-hole recombination centers to the light-emitting layer comprising the host and phosphorescent material. In one embodiment, such a blocking layer would be placed between the electron-transporting layer and the light-emitting layer—see FIG. 1, layer 110. In this case, the ionization potential of the blocking layer should be such that there is an energy barrier for hole migration from the host into the electron-transporting layer, while the electron affinity should be such that electrons pass more readily from the electron-transporting layer into the light-emitting layer comprising host and phosphorescent material. It is further desired, but not absolutely required, that the triplet energy of the blocking material be greater than that of the phosphorescent material. Suitable hole-blocking materials are described in WO 00/70655A2 and WO 01/93642 A1. Two examples of useful materials are bathocuproine, or 2,9-dimethyl-4,7-diphenyl-1,10-phenanthroline (BCP), and bis (2-methyl-8-quinolinolato)(4-phenylphenolato)Aluminum (III) (BAlQ). Metal complexes other than BAlQ are also known to block holes and excitons as described in US 20030068528. US 20030175553 A1 describes the use of fac-tris(1-phenylpyrazolato-N,C2)iridium (III) (Irppz) in an electron/exciton blocking layer.

Embodiments of the invention can provide advantageous features such as operating efficiency, higher luminance, color hue, low drive voltage, and improved operating stability. Embodiments of the organometallic compounds useful in the invention can provide a wide range of hues, including those usefull in the emission of white light (directly or through filters to provide multicolor displays).

General Device Architecture

The present invention can be employed in many OLED device configurations using small molecule materials, oligomeric materials, polymeric materials, or combinations thereof. These include very simple structures comprising a single anode and cathode, to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure, especially useful for of a small molecule device, is shown in FIG. 1 and is comprised of a substrate 101, an anode 103, a hole-injecting layer 105, a hole-transporting layer 107, a light-emitting layer 109, a hole- or exciton-blocking layer 110, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source through electrical conductors. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC-driven OLED is described in U.S. Pat. No. 5,552,678.

Substrate

The OLED device of this invention is typically provided over a supporting substrate 101 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials such as glass or polymers. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Again, the substrate can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, the trarsmissive characteristics of the anode are immaterial and any conductive material can be used, transparent, opaque or reflective. Example conductors for this application include, but are not limited to, gold, iridium, molybdenum, palladium, and platinum. Typical anode materials, trarsmissive or otherwise, have a work function of 4.1 eV or greater. Desired anode materials are commonly deposited by any suitable means such as vacuum thermal evaporative deposition, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Cathode

When light emission is viewed solely through the anode, the cathode used in this invention can be comprised of nearly any conductive material. Desirable materials have good film-forming properties to ensure good contact with the underlying organic layer, promote electron injection at low voltage, and have good stability. Usefull cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode an a thin electron-injection layer (EIL) in contact with an organic layer (e.g., an electron-transporting layer (ETL)), which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped $ALQ_3$ is another example of a usefull EIL. Other useful cathode material sets include, but are not limited to, those disclosed in U.S. Pat. Nos. 5,059,861, 5,059,862, and 6,140,763.

When light emission is viewed through the cathode, the cathode must be transparent or nearly tsansparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by any suitable method such as vacuum thermal evaporative deposition, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-injecting Layer (HIL)

A hole-injecting layer 105 may be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-transporting Layer (HTL)

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more desirable class of aromatic tertiary amines are those which include at least two aromatic tertiary amine moieties as described in U.S. Pat. Nos. 4,720,432 and 5,061,569. Such compounds include those represented by structural formula (A):

A

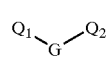

wherein $Q_1$ and $Q_2$ are independently selected aromatic tertiary amine moieties and G is a linking group such as an arylene, cycloalkylene, or alkylene group of a carbon-to-carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two trarylamine moieties is represented by structural formula (B):

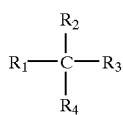

B wherein $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Usefull tetraaryldiamines include those represented by formula (D):

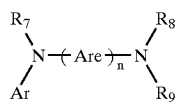

D wherein each Are is an independently selected arylene group, such as a phenylene or anthracene moiety, n is an integer of from 1 to 4, and Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene The various alkyl, alkylene, aryl, and arylene moieties of the foregoing Structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
N,N,N',N'-tetraphenyl-4,4'''-diamino-1,1':4',1":4",1'''-quaterphenyl
Bis(4-dimethylamino-2-methylphenyl)phenylmethane
1,4-bis[2-[4-[N,N-di(p-toly)amino]phenyl]vinyl]benzene (BDTAPVB)
N,N,N',N'-Tetra-p-tolyl-4,4'-diaminobiphenyl
N,N,N',N'-Tetraphenyl-4,4'-diaminobiphenyl
N,N,N',N-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
2,6-Bis[N,N-di(2-naphthyl)amino]fluorene
4,4',4"-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole)(PVK), polythiophenes, polypyrrole, polyaniline, and copolymers such as poly(3,4-ethylenedioxythiophene)/poly(4-styrenesulfonate) also called PEDOT/PSS.

Fluorescent Light-emitting Materials and Layers (LEL)

In addition to the phosphorescent materials of this invention, other light-emitting materials may be used in the OLED device, including fluorescent materials. Although the term "fluorescent" is commonly used to describe any light emitting material, in this case we are referring to a material that emits light from a singlet-excited state. Fluorescent materials may be used in the same layer as the phosphorescent material, in adjacent layers, in adjacent pixels, or any combination. Care must be taken not to select materials that will adversely affect the performance of the phosphorescent materials of this invention. One skilled in the art will understand that triplet excited state energies of materials in the same layer as the phosphorescent material or in an adjacent layer must be appropriately set so as to prevent unwanted quenching.

As more fully described in U.S. Pat. Nos. 4,769,292 and 5,935,721, the light-emitting layer (LEL) of the organic EL element includes a luminescent fluorescent or phosphorescent material where electroluminescence is produced as a result of electron-hole pair recombination in this region. The light-emitting layer can be comprised of a single material, but more commonly consists of a host material doped with a guest emitting material or materials where light emission comes primarily from the emitting materials and can be of any color. The host materials in the light-emitting layer can be an electron-transporting material, as defined below, a hole-transporting material, as defined above, or another material or combination of materials that support hole-electron recombination. Fluorescent emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small molecule emitting materials can be molecularly dispersed into a polymeric host, or the emitting materials can be added by copolymerizing a minor constituent into a host polymer. Host materials may be mixed together in order to improve film formation, electrical properties, light emission efficiency, lifetime, or manufacturability. The host may comprise a material that has good hole-transporting properties and a material that has good electron-transporting properties.

An important relationship for choosing a fluorescent dye as a guest-emitting material is a comparison of the singlet excited state energies of the host and light-emitting material. For efficient energy transfer from the host to the emitting material, a highly desirable condition is that the singlet excited state energy of the emitting material is lower than that of the host material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red:

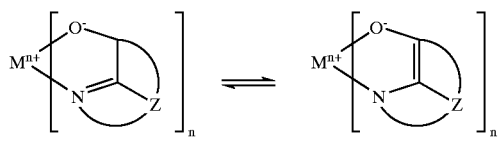

E wherein
   M represents a metal;
   n is an integer of from 1 to 4; and
   Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
   CO-1: Aluminum trisoxine [alias, tris(8-quinolinolato)aluminum (III)]
   CO-2: Magnesium bisoxine [alias, bis(8-quinolinolato)magnesium (II)]
   CO-3: Bis[benzo {f}-8-quinolinolato]zinc (II)
   CO-4: Bis(2-methyl-8-quinolinolato)aluminum (III)-$\mu$-oxo-bis(2-methyl-8-quinolinolato) aluminum (III)
   CO-5: Indium trisoxine [alias, tris(8-quinolinolato)indium]
   CO-6: Aluminum tris(5-methyloxine) [alias, tris(5-methyl-8-quinolinolato)aluminum (III)]
   CO-7: Lithium oxine [alias, (8-quinolinolato)lithium (I)]
   CO-8: Gallium oxine [alias, tris(8-quinolinolato)gallium (III)]
   CO-9: Zirconium oxine [alias, tetra(8-quinolinolato)zirconium (IV)]

Derivatives of 9,10-di-(2-naphthyl)anthracene (Formula F) constitute one class of useful host materials capable of supporting electroluminescence, and such derivatives are particularly suitable for light emission of wavelengths longer than 400 nm, e.g., blue, green, yellow, orange or red:

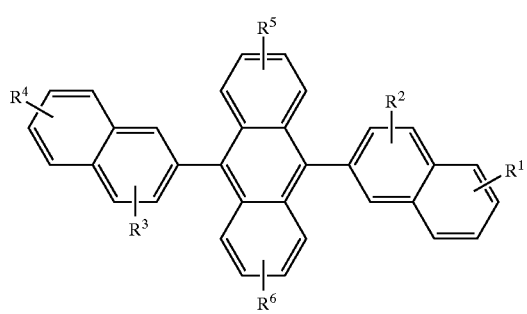

F wherein: $R^1$, $R^2$, $R^3$, $R^4$, $R^5$, and $R^6$ represent one or more substituents on each ring where each substituent is individually selected from the following groups:
   Group 1: hydrogen, or alkyl of from 1 to 24 carbon atoms;
   Group 2: aryl or substituted aryl of from 5 to 20 carbon atoms;
   Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyanide.

Illustrative examples include 9,10-di-(2-naphthyl) anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (Formula G) constitute another class of useful host materials capable of supporting electroluminescence, and are particularly suitable for light emission of wavelengths longer than 400 nm, e.g., blue, green, yellow, orange or red.

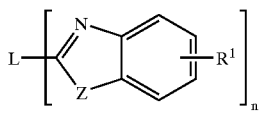

G

Where:
n is an integer of 3 to 8;
Z is O, NR or S; and
R and R' are individually hydrogen; alkyl of from 1 to 24 carbon atoms, for example, propyl, t-butyl, heptyl, and the like; aryl or hetero-atom substituted aryl of from 5 to 20 carbon atoms, for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together. An example of a useful benzazole is 2,2',2"-(1,3,5-phenylene)tris[1-phenyl-1H-benzimidazole].

Styrylarylene derivatives as described in U.S. Pat. No. 5,121,029 and JP 08333569 are also useful hosts for blue emission. For example, 9,10-bis[4-(2,2-diphenylethenyl)phenyl]anthracene and 4,4'-Bis(2,2-diphenylethenyl)-1,1'-biphenyl (DPVBi) are usefull hosts for blue emission.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostryl compounds. Illustrative examples of useful materials include, but are not limited to, the following:

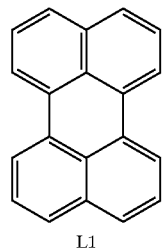

L1

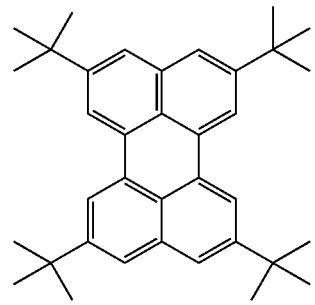

L2

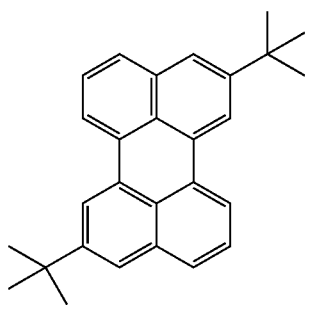

L3

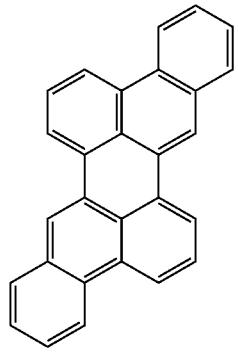

L4

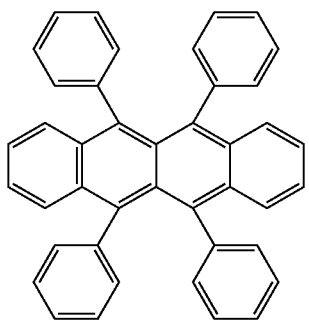
L5
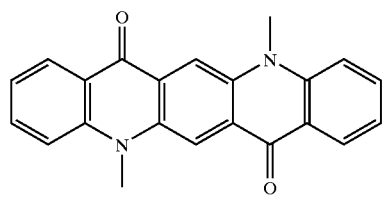
L6
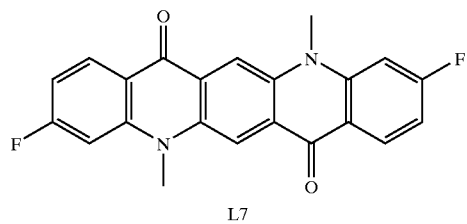
L7
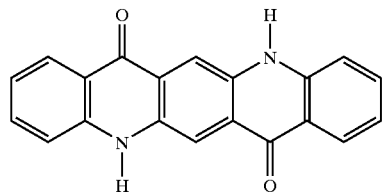
L8
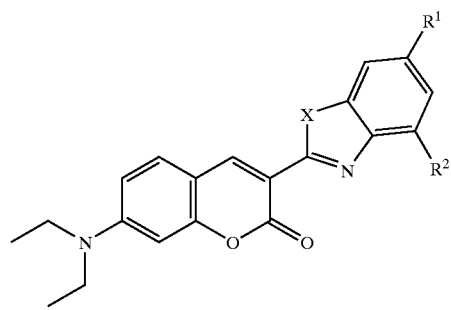
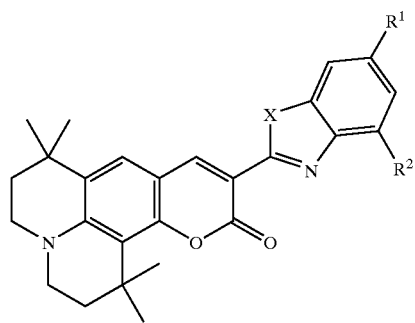
|     | X | R1      | R2      |     | X | R1      | R2      |
|-----|---|---------|---------|-----|---|---------|---------|
| L9  | O | H       | H       | L23 | O | H       | H       |
| L10 | O | H       | Methyl  | L24 | O | H       | Methyl  |
| L11 | O | Methyl  | H       | L25 | O | Methyl  | H       |
| L12 | O | Methyl  | Methyl  | L26 | O | Methyl  | Methyl  |
| L13 | O | H       | t-butyl | L27 | O | H       | t-butyl |
| L14 | O | t-butyl | H       | L28 | O | t-butyl | H       |
| L15 | O | t-butyl | t-butyl | L29 | O | t-butyl | t-butyl |
| L16 | S | H       | H       | L30 | S | H       | H       |

-continued
| | | | | | | | |
|---|---|---|---|---|---|---|---|
| L17 | S | H | Methyl | L31 | S | H | Methyl |
| L18 | S | Methyl | H | L32 | S | Methyl | H |
| L19 | S | Methyl | Methyl | L33 | S | Methyl | Methyl |
| L20 | S | H | t-butyl | L34 | S | H | t-butyl |
| L21 | S | t-butyl | H | L35 | S | t-butyl | H |
| L22 | S | t-butyl | t-butyl | L36 | S | t-butyl | t-butyl |
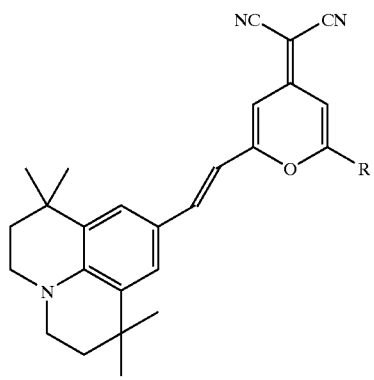 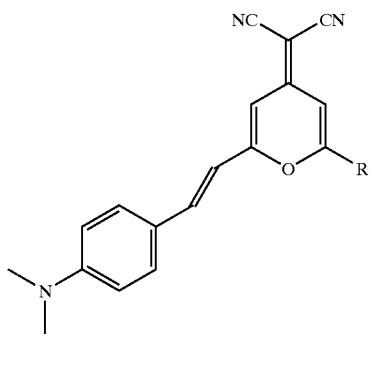
| | R | | R |
|---|---|---|---|
| L37 | phenyl | L41 | phenyl |
| L38 | methyl | L42 | methyl |
| L39 | t-butyl | L43 | t-butyl |
| L40 | mesityl | L44 | mesityl |
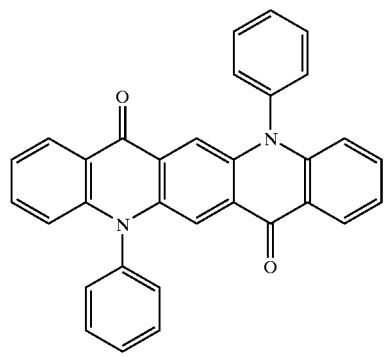 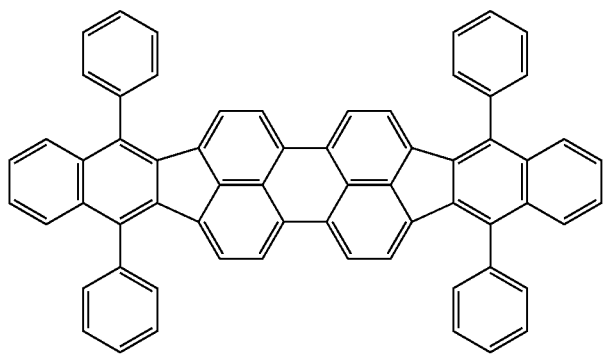
L45         L46

-continued
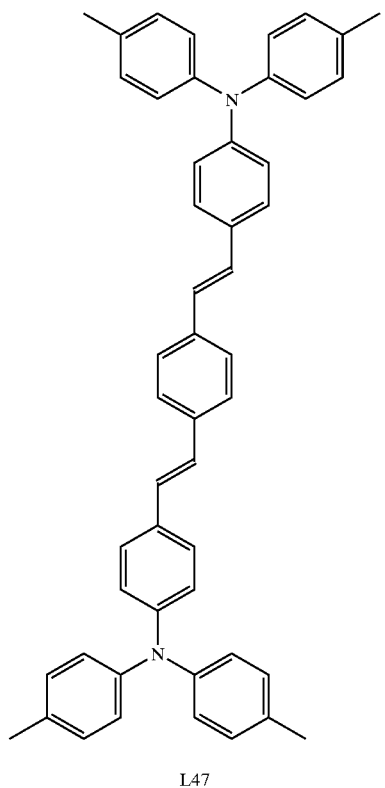
L47
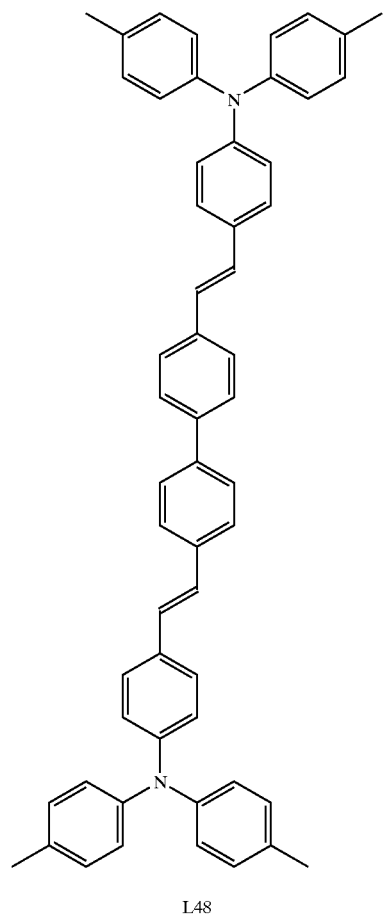
L48
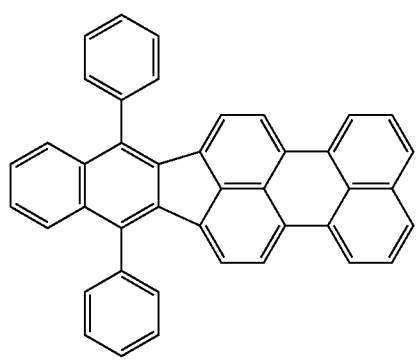
L49
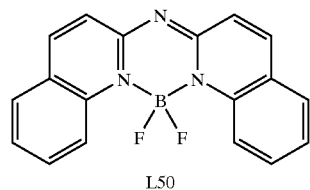
L50
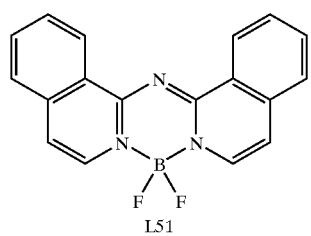
L51
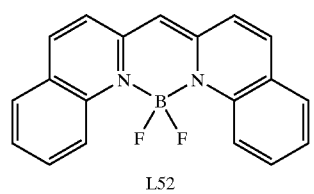
L52

Electron-transporting Layer (ETL)

Preferred thin film-forming materials for use in forming the electron-transporting layer 111 of the organic EL devices of this invention are metal-chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

Other Useful Organic Layers and Device Architecture

In some instances, layers 109 through 111 can optionally be collapsed into a single layer that serves the function of supporting both light emission and electron transportation. Layers 110 and 111 may also be collapsed into a single layer that functions to block holes or excitons, and which supports electron transportation. It also known in the art that emitting materials may be included in the hole-transporting layer, which may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. Nos. 5,683,823, 5,503,910, 5,405,709, and 5,283,182 and can be equipped with a suitable filter arrangement to produce a color emission.

This invention may be used in so-called stacked device architecture, for example, as taught in U.S. Pat. Nos. 5,703,436 and 6,337,492.

Deposition of Organic Layers

The organic materials mentioned above are suitably deposited by any means suitable for the form of the organic materials. In the case of small molecules, they are conveniently deposited through vacuum-assisted sublimation (vacuum thermal evaporative deposition), but can be deposited by other means such as from a solvent with an optional binder to improve film formation (solution processing). If the material is a polymer, solvent deposition is usually preferred. The material to be deposited by sublimation can be vaporized from a sublimator crucible or "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially defined thermal dye transfer from a donor sheet (U.S. Pat. Nos. 5,688,551, 5,851,709 and 6,066,357), and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calciulm sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror s replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the cover or as part of the cover.

EXAMPLES

The invention and its advantages can be better appreciated by the following specific embodiments. The suffix (C) designates control or comparative electroluminescent devices, while the suffix (I) indicates example electroluminescent devices.

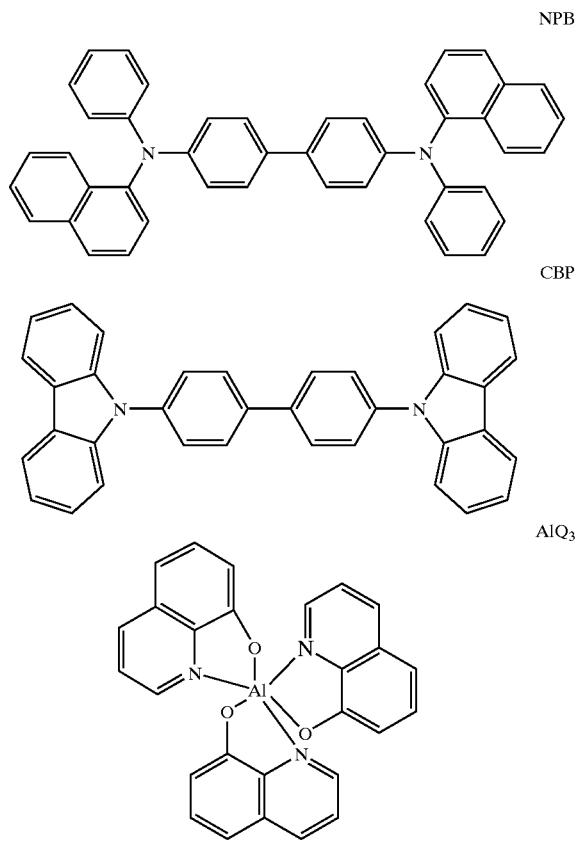

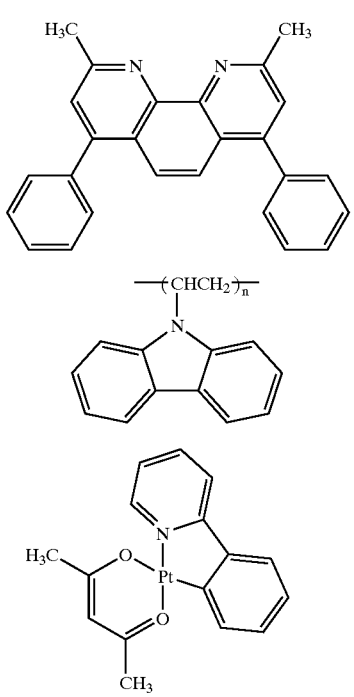

BCP

PVK ppyPtacac

Synthetic Example 1

This example illustrates the preparation of the platinum complexes of the invention. The tridentate (upon cyclometallation) ligand 4,6-diphenyl-2,2'-bipyridine was prepared by the following procedure:

1-(2-Pyridylcarbonylmethyl)pyridinium iodide (16.2 g, 0.050 mol) and 1,3-Diphenyl-2-propen-1-one (15.4 g, 0.050 mol) were combined with ammonium acetate (93 g), acetic acid (93 mL), and methanol (230 mL), and reaction mixture was refluxed under inert atmosphere for roughly 18 h. The reaction mixture was allowed to cool to ambient temperature and was then chilled in an ice bath to about 0° C. The white solid formed by the reaction was collected by filtration and was washed with chilled methanol until the rinsings were colorless. The crude solid (13.4 g) was recrystallized from 140 mL of acetonitrile providing white needles of 4,6-diphenyl-2,2'-bipyridine (11.5 g, 75%).

Inv-1 (4,6-diphenyl-2,2'-bipyridylplatinum (II) chloride) was prepared by combining dipotassium tetrachloroplatinate (1.5 g, 3.6 mmol) with 4,6-diphenyl-2,2'-bipyridine (1.2 g, 3.9 mmol) and argon-degassed glacial acetic acid (140 mL). The reaction mixture was heated with stiring under argon at ca. 100° C. for about 14 h. A fine yellow-orange product formed a suspension over denser red crystalline material. The reaction mixture was allowed to cool to ambient temperature and the yellow-orange suspension was decanted from the red residue and collected on a sintered-glass frit. The collected compound was washed with water, ethanol, and diethyl ether, and it was dried at ambient temperature in vacuo for 16 h (0.96 g, 52%). The solid was used in synthesis without further purification. The organometallic complex was recrystallized from a saturated solution of methylene chloride by slow evaporation to give fine yellow needles; Inv-1 purified in this manner was used to fabricate an OLED device by solution processing. A sample of Inv-1 suitable for incorporation in an OLED device by vacuum thermal deposition was purified by vacuum sublimation forming fine reddish-orange crystals in a Lindberg/Blue single-zone tube furnace at 308° C. and approximately 0.9 Torr using nitrogen carrier gas at a flow rate of ca. 7.5 standard cubic centimeters per second forming fine reddish-orange crystals.

Inv-2 (4,6-diphenyl-2,2'-bipyridylphenylplatinum (II)) was synthesized by the stirred reaction of 4,6-diphenyl-2,2'-bipyridylplatinum (II) chloride (0.66 g, 1.2 mmol) in anhydrous, degassed tetrahydrofuran solvent (20 mL) with a tetrahydrofuran-solution of phenylmagnesium bromide (1.0 M, 1.35 mL, 1.4 mmol) at −78° C. under an inert atmosphere of argon. The reaction mixture was allowed to warm to ambient temperature and was stirred an additional 3 h. The orange solid that formed was collected on a sintered glass frit and it was washed with water, ethanol, and diethyl ether. The crude Inv-2 was dried at ambient temperature in vacuo for 16 h (0.62 g, 87%). A 150-mg portion of crude Inv-1 was recrystallized from a solution of methylene chloride (approximately 100 mL) and heptane (about 10 mL) by slow evaporation at ambient temperature to produce fine, bright orange needles. A single crystal of the purified Inv-2 derived from this recrystallization was subjected to x-ray diffraction structural analysis using a Nonius Kappa CCD diffractometer with graphite-monochromated Mo Kα radiation. The structural assignment of Inv-2 was confirmed. Inv-2 purified in this manner was also used to fabricate an OLED device by solution processing. A sample of Inv-2 suitable for fabrication of an OLED device by vacuum thermal evaporative deposition was purified by vacuum sublimation in a Lindberg/Blue single-zone tube furnace at 290° C. and approximately 0.7–0.9 Torr using nitrogen carrier gas at a flow rate of ca. 7.5 standard cubic centimeters per second forming very fine red-orange crystals.

Device Example 1

A comparative control EL device (Sample 101) was constructed in the following manner employing vacuum thermal evaporative deposition by vacuum sublimation for material deposition as indicated:

1. A glass substrate coated with an 85-nm layer of indium-tin oxide (ITO) as the anode was sequentially ultrasonicated in a commercial detergent, rinsed in deionized water, degreased in toluene vapor and exposed to oxygen plasma for about 1 min.
2. Over the ITO was deposited a 1-nm fluorocarbon (CFx) hole-injecting layer (HIL) by plasma-assisted deposition of $CHF_3$.
3. A hole-transporting layer (HTL) of N,N'-di-1-naphthyl-N,N'-diphenyl-4,4'-aminobiphenyl (NPB) having a thickness of 75 nm was then evaporated from a tantalum boat.
4. A 35-nm light-emitting layer (LEL) of 4,4-N,N'-dicarbazole-biphenyl (CBP) was then deposited onto the hole-transporting layer. This material was also evaporated from a tantalum boat.
5. A hole-blocking layer of 2,9-dimethyl-4,7-diphenyl-1,10-phenanthroline (BCP) having a thickness of 10 nm was then evaporated from a tantalum boat.
6. A 40-nm electron-transporting layer (ETL) of tris(8-quinolinolato)aluminum (III) ($AlQ_3$) was then deposited onto the light-emitting layer. This material was also evaporated from a tantalum boat.
7. On top of the $AlQ_3$ layer was deposited a 220-nm cathode formed of a 10:1 ratio of Mg and Ag.

The above sequence completed the deposition of the EL device. The device was then hermetically packaged in a dry glove box for protection against ambient moisture and oxygen. The device cell thus prepared was tested for luminance and color properties at operating current densities of 0.5–100 mA/cm2, and results for a current density of 20 mA/cm2 are reported in Table I in the form of initial luminance, luminance efficiency, the wavelength of maximum emission and CIE (Commission Internaticnale de L'Eclairage) chromaticity coordinates.

Comparative control EL devices Samples 102–105 were fabricated in an identical manner to Sample 101, except only that organometallic compound ppyPtacac of the prior art was deposited in LEL at the level indicated in Table I relative to the light-emitting layer host compound, CBP, by vacuum thermal evaporation from a tantalum crucible. In all other regards, the structure and construction of these devices were the same as for the comparative control OLED device Sample 101. The device cells thus prepared were tested for initial luminance and color properties at operating current densities of 0.5–100 mA/cm2, and results for a current density of 20 mA/cm2 are reported in Table 1 in the form of luminance, luminance efficiency, the wavelength of maximum emission and CIE (Commission Internationale de L'Eclairage) chromaticity coordinates.

Example EL devices Samples 105–110 satisfying the requirements of the present invention were fabricated in an identical manner to Sample 101, except that organometallic compound Inv-1 or Inv-2 was deposited in LEL at the specified level indicated in Table 1 relative to the light-emitting layer host compound, CBP, by vacuum thermal evaporation from a tantalum crucible. In all other regards, the structure and construction of these devices were the same as for the comparative control OLED device Sample 101. The device cells thus prepared were tested for luminance and color properties at operating current densities of 0.5–100 mA/cm2, and results for a current density of 20 mA/cm2 are reported in Table I in the form of initial luminance, luminance efficiency, the wavelength of maximum emission and CE (Commission Internationale de L'Eclairage) chromaticity coordinates.

compound, indicating that energy was transferred efficiently from the host compound of the light-emitting layer to the added electrophosphorescent organometallic complex, which then emitted visible light. It is evident from comparison of the spectral radiance output at high and low current densities that the compounds of the invention, Inv-1 and Inv-2, experienced reduced radiant emission hue variability compared to the control compound ppyPtacac of the prior art.

Device Example 2

A comparative control EL device (Sample 201) was constructed in the following manner by employing spin coating for material deposition as indicated:

1. A glass substrate coated with an 85-mn layer of indium-tin oxide (ITO) as the anode was sequentially ultrasonicated in a commercial detergent, rinsed in deionized water, degreased in toluene vapor and exposed to ultraviolet light and ozone for several minutes.
2. Over the ITO was deposited a PEDOT hole-injecting layer (HIL) by spin coating an aqueous solution of PEDOT/PSS (1.3% in water, Baytron® P from H. C. Starck Inc.) using a controlled spinning rate of 1750 rpm to obtain the desired layer thickness of about 60 nm and then annealing the coating on a heated metal block in air at 120° C. for about 10 min.
3. A light-emitting layer (LEL) of poly(9-vinylcarbazole) host (PVK, Aldrich Chemical Co., used as received, typical $M_w$ 63,000, typical $M_n$ 19,000) was then deposited onto the layer of PEDOT. This material was spun cast from a filtered chlorobenzene solution (2% solids) using a controlled spinning rate of 1500 rpm to obtain a thickness of approximately 66 nm.
4. On top of LEL was deposited an electron-injection layer (EIL) 1.5-nm layer formed of cesium fluoride (CsF) using vacuum thermal evaporative deposition.

TABLE I

Performance of OLED Devices Prepared by Vacuum Thermal Evaporation

| Sample | Compound | Wt-% Complex | Luminance Efficiency (Cd/A) | Luminance (Cd/m$^2$) | Emission $\lambda_{max}$ (nm) | CIE (x, y) |
| --- | --- | --- | --- | --- | --- | --- |
| 101 (C) | None | — | 0.56 | 111 | 456 | (0.18, 0.21) |
| 102 (C) | ppyPtacac | 2 | 2.12 | 424 | 488 | (0.25, 0.46) |
| 103 (C) | ppyPtacac | 4 | 2.98 | 595 | 524 | (0.30, 0.49) |
| 104 (C) | ppyPtacac | 6 | 3.55 | 711 | 524 | (0.33, 0.50) |
| 105 (I) | Inv-1 | 2 | 8.40 | 1680 | 556 | (0.47, 0.51) |
| 106 (I) | Inv-1 | 3 | 8.68 | 1736 | 556 | (0.47, 0.51) |
| 107 (I) | Inv-1 | 6 | 8.25 | 1649 | 560 | (0.48, 0.51) |
| 108 (I) | Inv-2 | 2 | 2.46 | 492 | 576 | (0.49, 0.45) |
| 109 (I) | Inv-2 | 3 | 2.48 | 496 | 576 | (0.50, 0.46) |
| 110 (I) | Inv-2 | 6 | 1.85 | 370 | 576 | (0.52, 0.45) |

As can be seen from Table I, all tested electroluminescent devices incorporating an electrophosphorescent organometallic compound demonstrated increased luminance yield and luminance relative to the comparative device without an electrophosphorescent organometallic compound, Sample 101. In addition, organometallic complexes of the invention showed superior hue stability of the radiant emission over a similar series of levels of incorporated complex, compared to the reference organometallic compound ppyPtacac of the prior art.

Referring to FIGS. 2–5, all tested electroluminescent devices incorporating an electrophosphorescent organometallic compound demonstrated shifted color and wavelength of maximum emission, relative to the comparative device without an electrophosphorescent organometallic 5. On top of the CsF layer was deposited a 200-nm cathode layer formed of a 10:1 ratio of Mg and Ag using vacuum thermal evaporative deposition.

The above sequence completed the deposition of the EL device. The device was then hermetically packaged in a dry glove box for protection against ambient moisture and oxygen. The device cell thus prepared was tested for luminance and color properties at operating current densities of 0.5–100 mA/cm$^2$, and results for a current density of 20 mA/cm$^2$ are reported in Table II in the form of initial luminance, luminance efficiency, the wavelength of maximum emission and CIE (Commission Internationale de L'Eclairage) chromaticity coordinates.

Comparative control EL device Sample 202 was fabricated in an identical manner to Sample 201, except that a control organometallic compound ppyPtacac was deposited in LEL at up to 4.0% by weight relative to the light-emitting layer host compound, PVK, by spin coating a filtered chlorobenzene solution, depending on the solubility of the complex in chlorobenzene solution. The device cell thus prepared was tested for luminance and color properties at operating current densities of 0.5–100 mA/cm2, and results for a current density of 20 mA/cm2 are reported in Table II in the form of initial luminance, luminance efficiency, the wavelength of maximum emission and CIE (Commission Internationale de L'Eclairage) chromaticity coordinates.

Example EL devices Samples 203–204 satisfying the requirements of the present invention were fabricated in an identical manner to Sample 201, except only that an organometallic compound, Inv-1 or Inv-2, respectively, was deposited in LEL at up to 4.0% by weight relative to the light-emitting layer host compound, PVK, by spin coating a filtered chlorobenzene solution, depending on the solubility of the complex in chlorobenzene solution. In all other regards, the structure and construction of these devices were the same as for the comparative control OLED device Sample 201. The device cells thus prepared were tested for luminance and color properties at operating current densities of 0.5–100 mA/cm2, and results for a current density of 20 mA/cm2 are reported in Table II in the form of initial luminance, luminance efficiency, die wavelength of maximum emission and CIE (Commission Internationale de L'Eclairage) chromaticity coordinates.

TABLE II

Performance of OLED Devices Prepared by Solution Processing

| Sample | Compound | Wt-% Complex | Luminance Efficiency (Cd/A) | Luminance (Cd/m$^2$) | Emission $\lambda_{max}$ (nm) | CIE (x, y) |
|---|---|---|---|---|---|---|
| 201 (C) | None | — | 0.26 | 52 | 416 | (0.22, 0.15) |
| 202 (C) | ppyPtacac | 4 | 2.18 | 436 | 488 | (0.25, 0.54) |
| 203 (I) | Inv-1 | 4 | 1.68 | 336 | 560 | (0.46, 0.47) |
| 204 (I) | Inv-2 | 4 | 0.21 | 42 | 584 | (0.49, 0.43) |

As can be seen from Table II, all tested electroluminescent devices incorporating an electrophosphorescent organometallic compound demonstrated shifted wavelength of maximum emission and CIE hue coordinates relative to the device without an electrophosphorescent organometallic compound. In addition, their luminance and luminance yield was similar to or higher than that of the control device without an electrophosphorescent organometallic compound.

Referring to FIG. 6–9, all tested electroluminescent devices incorporating an electrophosphorescent organometallic compound clearly demonstrated shifted color and wavelength of maximum emission, relative to the comparative device without an electrophosphorescent organometallic compound, indicating that energy was transferred from the host compound of the light-emitting layer to the added electrophosphorescent organometallic complex, which then emitted visible light.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

Parts List

101 Substrate
103 Anode
105 Hole-Injecting layer (HIL)
107 Hole-Transporting layer (HTL)
109 Light-Emitting layer (LEL)
110 Hole-blocking layer (HBL)
111 Electron-Transporting layer (ETL)
113 Cathode

What is claimed is:

1. An electroluminescent device comprising a cathode, an anode, and, located there between, a light emitting layer (LEL) containing a light emitting material that contains an organometallic complex comprising Pt or Pd metal and a tridentate (N^N^C) ligand, wherein the tridentate (N^N^C) ligand represents a ligand that coordinates to the metal through a nitrogen donor bond, a second nitrogen donor bond, and a carbon-metal bond, in that order, wherein at least one of the nitrogen donors is part of an aromatic ring or an imine group, and wherein the Pt or Pd atom also forms a bond to an anionic ligand group L, wherein L represents alkyl, alkenyl, aryl, or a cyano carbon, or halogen, or RX, wherein X represents a substituent that forms a bond to the Pt or Pd atom and wherein X represents N, O, S, or Se, and R represents a substituent.

2. The device of claim 1 wherein the metal is Pt.

3. The device of claim 1 wherein the organometallic complex is part of the main chain of a polymer or is part of the side chain of a polymer.

4. The device of claim 1 wherein both of the nitrogen donors are part of an aromatic ring.

5. The device of claim 1 wherein the organometallic complex can be represented by Formula (1a):

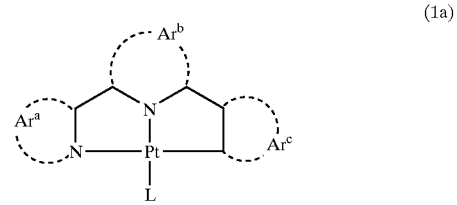

(1a)

wherein:

A$^a$, Ar$^b$, and Ar$^c$ independently represent the atoms necessary to form a five or six-membered aromatic ring group; and L is an anionic ligand.

6. The device of claim 5, wherein Ar$^a$, Ar$^b$, and Ar$^c$ independently represent the atoms necessary to form a six-membered aromatic ring group.

7. The device of claim 5, wherein Ar$^a$ and Ar$^b$ independently represent the atoms necessary to form a pyridine ring group.

8. The device of claim 5, wherein Ar$^c$ represents the atoms necessary to form a benzene ring group.

9. The device of claim 5, wherein L represents halogen.

10. The device of claim 5, wherein L represents fluoride.

11. The device of claim 5 wherein L represents an alkenyl group, an aryl group, an alkyl group, or a cyano group.

12. The device of claim 5, wherein L represents RX, wherein X represents a substituent that forms a bond to platinum and wherein X represents N, O, S, or Se, and R represents a substituent.

13. The device of claim 1 wherein the organometallic complex is represented by Formula (1b):

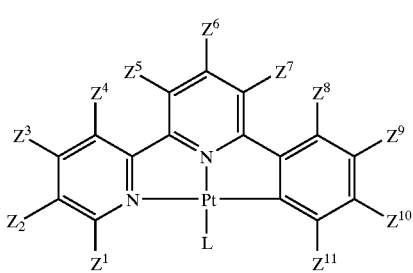

(1b)

wherein, $Z^1$–$Z^{11}$ each represent hydrogen or independently selected substituent groups, provided that adjacent substituent groups can combine to form rings, and provided that $Z^4$ and $Z^5$, and $Z^7$ and $Z^8$ can also combine to form rings; and L represents an anionic ligand.

14. The device of claim 13, wherein L represents halogen, an alkenyl group, an aryl group, an alkyl group, or a cyano group, or L represents RX, wherein X represents a substituent that forms a bond to platinum where X represents N, O, S, or Se, and where R represents a substituent.

15. The device of claim 1 wherein the organometallic complex can be represented by Formula (1c):

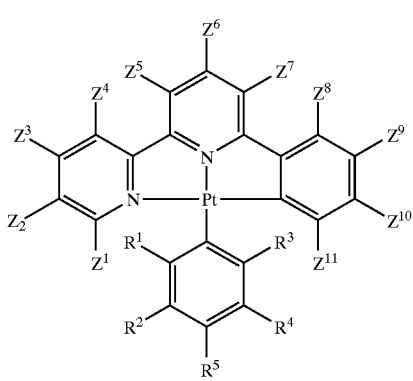

(1c)

wherein, $Z^1$–$Z^{11}$ represent H or independently selected substituent groups, provided that adjacent substituent groups can combine to form rings, and provided that $Z^4$ and $Z^5$, and $Z^7$ and $Z^8$ can also combine to form rings; and $R^1$–$R^5$ represent hydrogen or independently selected substituents, provided that adjacent substituent groups can combine to form ring groups.

16. The device of claim 15, wherein $R^1$ and $R^2$ of Formula (1c) combine to form a six-membered ring group.

17. The device of claim 15, wherein $R^1$ of Formula (1c) is a 1–12 carbon alkyl group.

18. The device of claim 15, wherein $R^1$ and $R^2$, of Formula (1c), combine to form a six-membered ring group and $R^3$ and $R^4$ also combine to form a six-membered ring group, or $R^1$ and $R^3$ independently represent a 1–12 carbon alkyl group.

19. The device of claim 1 wherein the organometallic complex contains an N-heterocyclic ligand.

20. The device of claim 19 wherein the organometallic complex contains a quinolinyl or an isoquinolinyl ligand group.

21. The device of claim 1 wherein the light-emitting material is a dopant compound and is disposed in a host material.

22. The device of claim 21 wherein the dopant compound is present in an amount of up to 15 wt % based on the host.

23. The device of claim 1 including a means for emitting white light.

24. The device of claim 23 including two or more compounds capable of emitting complimentary colors.

25. The device of claim 23 including a compound capable of emitting white light.

26. The device of claim 23 including a filtering means.

27. The device of claim 1 including a fluorescent emitting material.

28. The device of claim 1 wherein the organometallic complex is present in a compound containing 2 or more complexes.

29. A display comprising the electroluminescent device of claim 1.

30. An area lighting device comprising the electroluminescent device of claim 1.

31. A process for emitting light comprising applying a potential across the device of claim 1.

* * * * *

UNITED STATES PATENT AND TRADEMARK OFFICE
CERTIFICATE OF CORRECTION

PATENT NO. : 6,824,895 B1
DATED : November 30, 2004
INVENTOR(S) : Allan F. Sowinski et al.

It is certified that error appears in the above-identified patent and that said Letters Patent is hereby corrected as shown below:

Column 44,
Line 56, delete "$A^a$" insert -- $Ar^a$ --

Signed and Sealed this

Nineteenth Day of April, 2005

JON W. DUDAS
*Director of the United States Patent and Trademark Office*